(12) United States Patent  
Koike et al.

(10) Patent No.: US 12,424,273 B2  
(45) Date of Patent: Sep. 23, 2025

(54) STORAGE CIRCUIT PROVIDED WITH VARIABLE RESISTANCE TYPE ELEMENTS

(71) Applicant: TOHOKU UNIVERSITY, Sendai (JP)

(72) Inventors: Hiroki Koike, Sendai (JP); Tetsuo Endoh, Sendai (JP)

(73) Assignee: TOHOKU UNIVERSITY, Sendai (JP)

( * ) Notice: Subject to any disclaimer, the term of this patent is extended or adjusted under 35 U.S.C. 154(b) by 0 days.

(21) Appl. No.: 17/653,033

(22) Filed: Mar. 1, 2022

(65) Prior Publication Data  
US 2022/0406366 A1 Dec. 22, 2022

(30) Foreign Application Priority Data

Mar. 3, 2021 (JP) .................................. 2021-033868

(51) Int. Cl.  
*G11C 11/4099* (2006.01)  
*G11C 11/4091* (2006.01)  
*G11C 11/4093* (2006.01)

(52) U.S. Cl.  
CPC ...... *G11C 11/4099* (2013.01); *G11C 11/4091* (2013.01); *G11C 11/4093* (2013.01)

(58) Field of Classification Search  
CPC .................. G11C 11/4091; G11C 11/4093  
USPC .................................................. 365/189.09  
See application file for complete search history.

(56) References Cited

U.S. PATENT DOCUMENTS

| 5,642,308 A | 6/1997 | Yoshida |
| 6,191,979 B1 | 2/2001 | Uekubo |
| 7,599,220 B2 | 10/2009 | Lin et al. |

(Continued)

FOREIGN PATENT DOCUMENTS

| JP | 11066890 A | 3/1999 |
| JP | 2001243760 A | 9/2001 |

(Continued)

OTHER PUBLICATIONS

Tetsuo Endoh et al.; U.S. Appl. No. 17/395,210, filed Aug. 5, 2021.

(Continued)

*Primary Examiner* — Anthan Tran  
(74) *Attorney, Agent, or Firm* — Greer Burns & Crain Ltd.

(57) ABSTRACT

A storage circuit includes a memory cell array of memory cells each including a variable resistance type element, a resistance-voltage conversion circuit $RT_j$ to convert a resistance value of a memory cell $MC_{ij}$ to be read to a data voltage, a reference circuit and $RT_R$ to generate a reference voltage, a sense amplifier to determine read data by receiving the data voltage and the reference voltage via first and second input terminals, respectively, and comparing both voltages with each other, and an analog buffer circuit arranged between the resistance-voltage conversion circuit $RT_j$ and a first input terminal of the sense amplifier or between the reference circuit and $RT_R$ and a second input terminal of the sense amplifier. Current driving capability of the analog buffer circuit is large.

13 Claims, 17 Drawing Sheets

(56) References Cited

U.S. PATENT DOCUMENTS

| | | | |
|---|---|---|---|
| 7,630,262 B2* | 12/2009 | Kang | G11C 11/404 |
| | | | 365/207 |
| 8,565,004 B2 | 10/2013 | Iijima et al. | |
| 9,697,895 B1 | 7/2017 | Zaitsu | |
| 10,665,282 B2 | 5/2020 | Koike et al. | |
| 2001/0015906 A1 | 8/2001 | Schneider et al. | |
| 2001/0033514 A1 | 10/2001 | Takata et al. | |
| 2001/0053093 A1 | 12/2001 | Ogura et al. | |
| 2002/0053943 A1 | 5/2002 | Yamasaki et al. | |
| 2002/0054515 A1 | 5/2002 | Kang | |
| 2002/0191467 A1 | 12/2002 | Matsumoto et al. | |
| 2004/0027904 A1 | 2/2004 | Morikawa | |
| 2004/0032759 A1 | 2/2004 | Chow et al. | |
| 2004/0120200 A1 | 6/2004 | Gogl et al. | |
| 2005/0030809 A1 | 2/2005 | Vimercati et al. | |
| 2005/0169038 A1 | 8/2005 | Inoue et al. | |
| 2005/0195634 A1 | 9/2005 | Ishida et al. | |
| 2006/0067097 A1 | 3/2006 | Lien et al. | |
| 2006/0083070 A1 | 4/2006 | Arakawa | |
| 2006/0146625 A1 | 7/2006 | Morita | |
| 2007/0159867 A1 | 7/2007 | Muraoka et al. | |
| 2008/0186776 A1 | 8/2008 | Kim et al. | |
| 2009/0010079 A1 | 1/2009 | Kang et al. | |
| 2009/0268509 A1 | 10/2009 | Maejima | |
| 2010/0073999 A1 | 3/2010 | Kitai et al. | |
| 2010/0128515 A1 | 5/2010 | Fukushi | |
| 2010/0142303 A1 | 6/2010 | Park et al. | |
| 2010/0157654 A1 | 6/2010 | Jung et al. | |
| 2010/0165701 A1 | 7/2010 | Ueda et al. | |
| 2011/0026348 A1 | 2/2011 | Narui | |
| 2012/0033506 A1 | 2/2012 | Furutani et al. | |
| 2012/0057400 A1 | 3/2012 | Kim et al. | |
| 2012/0163075 A1 | 6/2012 | Tanikawa et al. | |
| 2012/0250437 A1 | 10/2012 | Nagata | |
| 2013/0163361 A1 | 6/2013 | Nomoto et al. | |
| 2013/0223170 A1 | 8/2013 | Kajigaya | |
| 2013/0250654 A1 | 9/2013 | Sugimae et al. | |
| 2013/0268727 A1 | 10/2013 | Sohn et al. | |
| 2013/0268795 A1 | 10/2013 | Nomura et al. | |
| 2013/0308403 A1 | 11/2013 | Nakai et al. | |
| 2013/0322161 A1 | 12/2013 | Noguchi et al. | |
| 2013/0329489 A1 | 12/2013 | Kim et al. | |
| 2014/0025866 A1 | 1/2014 | Kim et al. | |
| 2014/0050010 A1 | 2/2014 | Toda | |
| 2014/0056058 A1 | 2/2014 | Jefremow et al. | |
| 2014/0092680 A1 | 4/2014 | Lee et al. | |
| 2014/0157065 A1 | 6/2014 | Ong | |
| 2014/0244930 A1 | 8/2014 | Lee | |
| 2014/0334222 A1 | 11/2014 | Bateman et al. | |
| 2015/0003137 A1 | 1/2015 | Lee et al. | |
| 2015/0035032 A1 | 2/2015 | Kang et al. | |
| 2015/0037931 A1 | 2/2015 | Kuniya | |
| 2015/0049536 A1 | 2/2015 | Oh et al. | |
| 2015/0070978 A1 | 3/2015 | Kim et al. | |
| 2015/0131387 A1 | 5/2015 | Jeon et al. | |
| 2015/0146494 A1 | 5/2015 | Riho | |
| 2015/0170730 A1 | 6/2015 | Antonyan | |
| 2015/0194212 A1 | 7/2015 | Faraoni et al. | |
| 2015/0206584 A1 | 7/2015 | Tsai et al. | |
| 2015/0235703 A1 | 8/2015 | Sakimura et al. | |
| 2015/0255165 A1 | 9/2015 | Tran et al. | |
| 2015/0279487 A1 | 10/2015 | Pious et al. | |
| 2015/0332760 A1 | 11/2015 | Kim et al. | |
| 2015/0348624 A1 | 12/2015 | Jang et al. | |
| 2016/0078915 A1 | 3/2016 | Katayama | |
| 2016/0093352 A1 | 3/2016 | Jung et al. | |
| 2016/0093800 A1 | 3/2016 | Matsunami | |
| 2016/0180948 A1 | 6/2016 | Tanabe | |
| 2016/0260482 A1 | 9/2016 | Sugimae et al. | |
| 2016/0293268 A1* | 10/2016 | Jan | G11C 17/18 |
| 2018/0025778 A1 | 1/2018 | Mori et al. | |
| 2018/0137913 A1 | 5/2018 | Kim | |
| 2018/0277187 A1 | 9/2018 | Ikegami et al. | |
| 2018/0350419 A1* | 12/2018 | Koike | G11C 11/161 |
| 2019/0088289 A1 | 3/2019 | Ishii | |
| 2019/0088322 A1 | 3/2019 | Pyo et al. | |
| 2019/0130945 A1 | 5/2019 | Hendrickson | |
| 2020/0381032 A1 | 12/2020 | Koike et al. | |
| 2021/0118481 A1 | 4/2021 | Yoshioka | |

FOREIGN PATENT DOCUMENTS

| | | |
|---|---|---|
| JP | 2002197853 A | 7/2002 |
| JP | 2002260377 A | 9/2002 |
| JP | 2003257177 A | 9/2003 |
| JP | 2003281880 A | 10/2003 |
| JP | 2003317467 A | 11/2003 |
| JP | 2003346475 A | 12/2003 |
| JP | 2004046962 A | 2/2004 |
| JP | 2004103202 A | 4/2004 |
| JP | 2005518627 A | 6/2005 |
| JP | 2008171564 A | 7/2008 |
| JP | 2009238327 A | 10/2009 |
| JP | 2010049751 A | 3/2010 |
| JP | 2011065701 A | 3/2011 |
| JP | 2011204287 A | 10/2011 |
| JP | 2012511223 A | 5/2012 |
| JP | 2012230725 A | 11/2012 |
| JP | 2013161502 A | 8/2013 |
| JP | 2013542544 A | 11/2013 |
| JP | 5492324 B1 | 5/2014 |
| JP | 2015052938 A | 3/2015 |
| JP | 2015115083 A | 6/2015 |
| JP | 2018156556 A | 10/2018 |
| JP | 2019053804 A | 4/2019 |
| JP | 2019053811 A | 4/2019 |
| JP | 2021064428 A | 4/2021 |
| WO | 2008044300 A1 | 4/2008 |
| WO | 2009034603 A1 | 3/2009 |
| WO | 2015083754 A1 | 6/2015 |
| WO | 2016067805 A1 | 5/2016 |
| WO | 2016186086 A1 | 11/2016 |
| WO | 2019112068 A1 | 6/2019 |

OTHER PUBLICATIONS

Hiroki Koike et al; U.S. Appl. No. 16/770,411, filed Jun. 5, 2020.
Hiroki Koike et al; U.S. Appl. No. 15/573,904, filed Aug. 13, 2018; issued as U.S. Pat. No. 10,665,282 on May 26, 2020.
Takashi Ohsawa et al; U.S. Appl. No. 15/101,809, filed Jun. 3, 2016; issued as U.S. Pat. No. 9,633,708 on Apr. 25, 2017.
Written opinion issued in PCT/JP2014/082040, dated Jan. 13, 2015.
Written opinion issued in PCT/JP2016/064531, dated Aug. 2, 2016.
Office action issued in counterpart JP Application No. 2015-551550, dated Apr. 10, 2018.
Intl Preliminary report on patentability issued in PCT/JP2016/064531, dated Jan. 17, 2017.
Written opinion issued in PCT/JP2018/045354, mailed Jan. 15, 2019.
Qing Dong et al., "A 1-Mb 28nm 1T1IMTJ STT-MRAM With Single-Cap Offset-Cancelled Sense Amplifier and In Situ Self-Write-Termination", IEEE Journal of Solid-State Circuits, vol. 54, No. 1, pp. 231-239, Jan. 2019.
T. Ohsawa et al., "Hi-Density and Low-Power Nonvolatile Static Random Access Memory Using Spin-Transfer-Torque Magnetic Tunnel Junction", Japanese Journal of Applied Physics 51, 2012, pp. 02BDO1-1-02BDO1-6.
S. Yamamoto et al., "Nonvolatile Static Random Access Memory Using Magnetic Tunnel Junctions with Current-Induced Magnetization Switching Architecture", Japanese Journal of Applied Physics 48, 2009, pp. 043001-1-043001-7.
K. Abe et al., "Hierarchical Cache Memory based on MRAM and Nonvolatile SRAM with Perpendicular Magnetic Tunnel Junctions for Ultra Low Power System", Solid State Devices Materials 2010, pp. 1144-1145.
Office Action issued in corresponding Japanese patent application No. 2021-033868, dated Dec. 10, 2024.

(56) References Cited

OTHER PUBLICATIONS

Office Action issued in related JP patent application No. 2021-130175, dated Mar. 11, 2025.

* cited by examiner

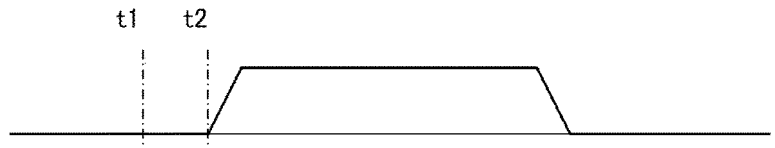
FIG. 3A  WLi
FIG. 3B  CLj, CLR
FIG. 3C  RE
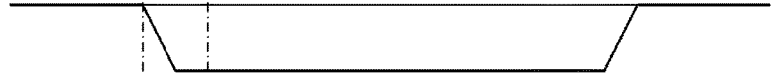
FIG. 3D  RGj, RGR
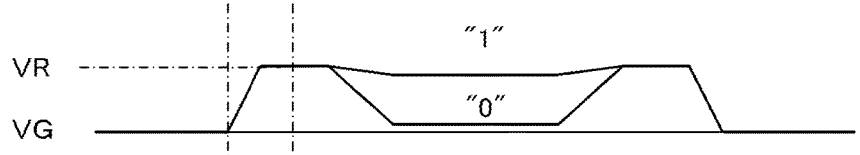
FIG. 3E  BLj1  Vb1
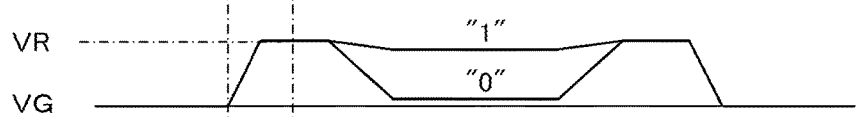
FIG. 3F  BLj2  Vb2
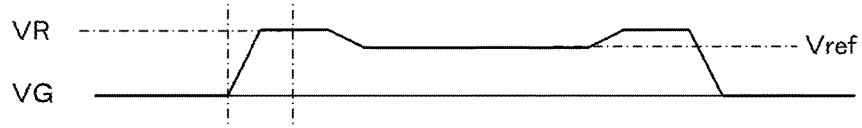
FIG. 3G  BLR1
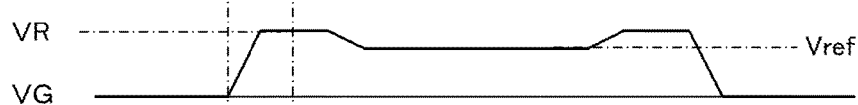
FIG. 3H  BLR2
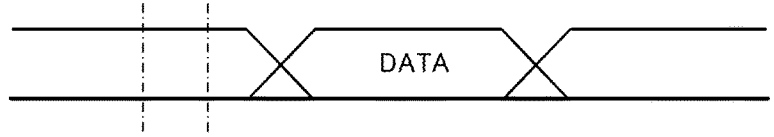
FIG. 3I  DATA WRITING OF "0"
FIG. 4A    WLi 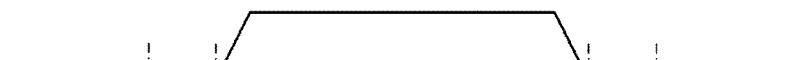
FIG. 4B    CLj 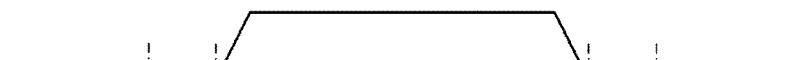
FIG. 4C    WBLH, WSLL 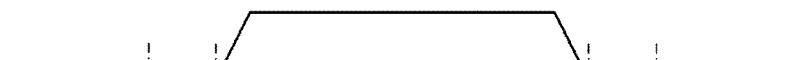
FIG. 4D    WBLL, WSLH 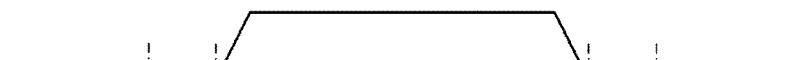
FIG. 4E    BLj    VW / VG 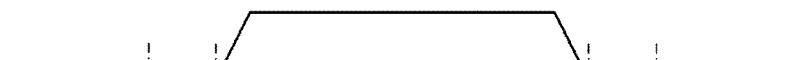
FIG. 4F    SLj    VG 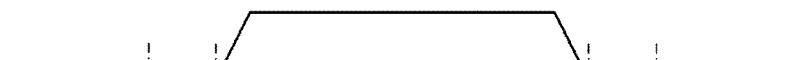

WRITING OF "1"
FIG. 5A  WLi
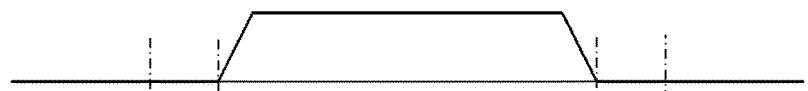
FIG. 5B  CLj
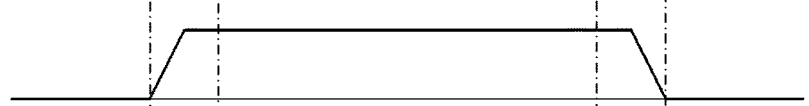
FIG. 5C  WBLH, WSLL
FIG. 5D  WBLL, WSLH
FIG. 5E  BLj
FIG. 5F  SLj
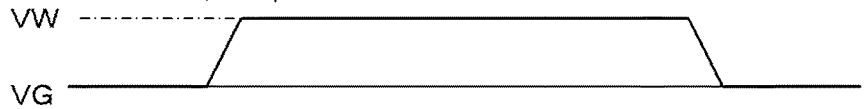

STORAGE CIRCUIT PROVIDED WITH VARIABLE RESISTANCE TYPE ELEMENTS

FIELD

This disclosure relates to a storage circuit provided with a variable resistance type elements as storage cells.

BACKGROUND

Storage circuits using magnetoresistive effect elements as memory cells have been developed. A storage circuit of this type compares voltage of a bit line corresponding to stored data with a reference voltage by use of a sense amplifier and thereby determines the stored data when reading data.

International Publication No. WO 2016/186086 discloses a configuration in which a reference cell is arranged for each row of a memory cell array. In FIG. 16 of the present application, a configuration of a read circuit portion of the storage circuit illustrated in FIG. 1 of International Publication No. WO 2016/186086 is illustrated. In this description, it is assumed that a memory cell to be read is a memory cell $MC_{2n}$ in the second row and the n-th column. In this case, current $I_{cell}$ flows from a read load transistor $RT_n$ to the memory cell $MC_{2n}$ via a route P1. A portion of the current $I_{cell}$ temporarily flows into a bit line $BL_n$ and a vertical bit line VBL and charges the bit line $BL_n$ and the vertical bit line VBL. Thus, voltage of the bit line $BL_n$ changes to a voltage (hereinafter, referred to as a data voltage) $V_b$ corresponding to stored data. The data voltage $V_b$ is transmitted to a positive input terminal of a sense amplifier SA via routes P2 and P3.

A reference cell $RC_2$ in the same row as the row of the memory cell $MC_{2n}$ to be read is also selected. As a result, current $I_{ref}$ flows from a reference read load transistor $RT_R$ to the reference cell $RC_2$ via a route R1. As a result, voltage of reference bit line $BL_R$ changes to a reference voltage $V_{ref}$ and is transmitted to a negative input terminal of the sense amplifier SA via routes R2 and R3.

The sense amplifier SA differentially amplifies the data voltage $V_b$ and the reference voltage $V_{ref}$ and outputs data DATA stored in the selected memory cell $MC_{2n}$.

In the storage circuit illustrated in FIG. 16, a route through which the data voltage $V_b$ is transmitted to the sense amplifier SA is from the route P2 to the route P3, and the route P3 is longest when j=n. In contrast, a route through which the reference voltage $V_{ref}$ is transmitted to the sense amplifier SA is the route R2 to the route R3. From the structural perspective, P2≈R2 and P3>R3 hold, and, when j=n, a difference in distance between the routes P3 and R3 is largest. Therefore, a difference occurs between time (hereinafter, referred to as "wiring driving time") required to transmit the data voltage $V_b$ to the sense amplifier SA and wiring driving time of the reference voltage $V_{ref}$. The difference limits read speed.

Major factors determining the wiring driving time are resistance and floating capacitance of wiring. The wiring resistance among the two factors can be reduced by thickening the wiring and thereby reducing the resistance. However, it is difficult to reduce floating capacitance of wiring (wiring capacitance). For example, when the wiring is thickened, the floating capacitance becomes large.

It is also conceivable that, in order to shorten wiring driving time, on-resistance of the read load transistors $RT_j$ is made small and wiring capacitance is rapidly charged. However, when the on-resistance of the read load transistors $RT_j$ is made small, read current $I_{cell}$ flowing through a memory cell $MC_{ij}$ is caused to become large. Thus, there is a possibility that memory cell data destruction caused by read operation (read disturb) occurs.

Storage circuits have been developed in technological trends toward miniaturization of individual elements and large-scaling of the entire circuit. Since size of a storage circuit increases because of the technological trends, wiring capacitance tends to increase. On the other hand, in order to maintain read margin of the sense amplifier SA, the data voltage $V_b$ cannot be changed largely. For the purpose of miniaturization of a memory cell MC, the read current $I_{cell}$ tends to become smaller and the on-resistance of the read load transistors RT tends to become larger from a viewpoint of preventing read disturb. In respect of the above-described situation, due to miniaturization of individual elements and large-scaling of the entire circuit, read speed is expected to become slower.

In order to solve such problems, causing a storage circuit to have a configuration in which, as disclosed in International Publication No. WO 2019/112068, a sense amplifier is disposed for each bit line is conceivable. However, in the case of this configuration, wiring for transmitting the reference voltage $V_{ref}$ from a reference circuit to a plurality of sense amplifiers becomes long. Thus, the wiring driving time is caused to become large and the read speed becomes slow, which causes a similar problem to occur.

SUMMARY

The present disclosure has been made in consideration of the above-described situation, and an objective of the present disclosure is to provide a storage circuit that allows miniaturization and large-scaling and is capable of increasing read speed.

In order to achieve the objective described above, a storage circuit according to a first aspect of the present disclosure includes:

a memory cell array including a matrix of memory cells each of which includes a variable resistance type element, the variable resistance type element having a resistance value changing in at least two steps;

a resistance-voltage conversion circuit to convert a resistance value of a memory cell to be read in the memory cell array to a data voltage;

a reference circuit to generate a reference voltage used for comparison with the data voltage;

a sense amplifier to determine data stored in the memory cell to be read by receiving the data voltage and the reference voltage via first and second input terminals, respectively, and comparing both voltages with each other; and an analog buffer circuit arranged at least one of between the resistance-voltage conversion circuit and a first input terminal of the sense amplifier or between the reference circuit and a second input terminal of the sense amplifier.

For example, the resistance-voltage conversion circuit is arranged for each column of the memory cell array and each of the resistance-voltage conversion circuits converts a resistance value of a memory cell to be read in a corresponding column to a data voltage, the analog buffer circuit is arranged in at least one column in the memory cell array and buffers a data voltage generated by a resistance-voltage conversion circuit of the column and transmits the buffered data voltage to a first input terminal of the sense amplifier, and current driving capability of the analog buffer circuit is higher than current driving capability of a resistance-voltage conversion circuit of the column.

The analog buffer circuit is, for example, arranged in two or more columns in the memory cell array, and each of the analog buffer circuits has a different current driving capability according to distance between the resistance-voltage conversion circuit of the column and a first input terminal of the sense amplifier.

For example, the resistance-voltage conversion circuit and the sense amplifier are arranged in each of a plurality of columns in the memory cell array, the analog buffer circuit buffers a reference voltage output by the reference circuit and transmits the buffered reference voltage to second input terminals of the plurality of sense amplifiers, and current driving capability of the analog buffer circuit is higher than current driving capability of the reference circuit.

The analog buffer circuit is, for example, capable of adjusting current driving capability according to distance to the sense amplifier of a column to be accessed.

For example, the analog buffer circuit includes a transistor circuit, and current driving capability of the analog buffer circuit is adjusted by size of a transistor included in a transistor circuit.

For example, current driving capability of the analog buffer circuit is adjusted by power-supply voltage of the analog buffer circuit.

The analog buffer circuit, for example, has an amplification factor of one-fold and converts impedance.

For example, the analog buffer circuit includes source follower circuits arranged both between the resistance-voltage conversion circuit and a first input terminal of the sense amplifier and between the reference circuit and a second input terminal of the sense amplifier.

In order to achieve the objective described above, a storage circuit according to a second aspect of the present disclosure includes:

a memory cell array including a matrix of memory cells each of which includes a variable resistance type element, the variable resistance type element having a resistance value changing in at least two steps;

a resistance-voltage conversion circuit disposed for each column of the memory cell array and configured to convert a resistance value of a memory cell to be read in a same column to a data voltage;

a reference circuit to generate a reference voltage used for comparison with the data voltage; and a sense amplifier disposed for each column of the memory cell array and configured to determine data stored in the memory cell to be read by receiving the data voltage generated by the resistance-voltage conversion circuit in a same column and a reference voltage generated by the reference circuit via first and second input terminals, respectively, and comparing both voltages with each other, in which the reference circuit has a higher current driving capability than each of the resistance-voltage conversion circuits.

For example, the reference circuit includes a reference cell including a variable resistance type element having a resistance value changing and a reference voltage conversion circuit to convert a resistance value of the reference cell to a reference voltage, and current driving capability of the reference voltage conversion circuit is higher than current driving capability of the resistance-voltage conversion circuits.

The reference circuit is, for example, capable of adjusting current driving capability according to distance to the sense amplifier of a column to be accessed.

For example, each of the reference voltage conversion circuit and the resistance-voltage conversion circuits includes a transistor circuit and has current driving capability adjusted by size of a transistor included in a transistor circuit.

For example, current driving capability of the reference voltage conversion circuit is adjusted by power-supply voltage of the reference voltage conversion circuit.

For example, the reference voltage conversion circuit is arranged in a plurality in parallel with one another. In this case, the storage circuit may include means for controlling the number of the reference voltage conversion circuits to be activated.

According to the present disclosure, wiring through which a signal is transmitted can be charged at high speed by the analog buffer circuit or the reference circuit. Therefore, miniaturization and large-scaling of a storage circuit are achievable and it is possible to increase read speed of the storage circuit.

BRIEF DESCRIPTION OF THE DRAWINGS

A more complete understanding of this application can be obtained when the following detailed description is considered in conjunction with the following drawings, in which:

FIGS. 3A to 3I are timing charts for a description of read operation of the storage circuit illustrated in FIG. 1;

FIGS. 4A to 4F are timing charts for a description of operation of writing data "0" into a memory cell in the storage circuit illustrated in FIG. 1;

FIGS. 5A to 5F are timing charts for a description of operation of writing data "1" into a memory cell in the storage circuit illustrated in FIG. 1;

DETAILED DESCRIPTION

Storage circuits according to embodiments of the present disclosure are described below with reference to the drawings.

Embodiment 1

Figure 1:
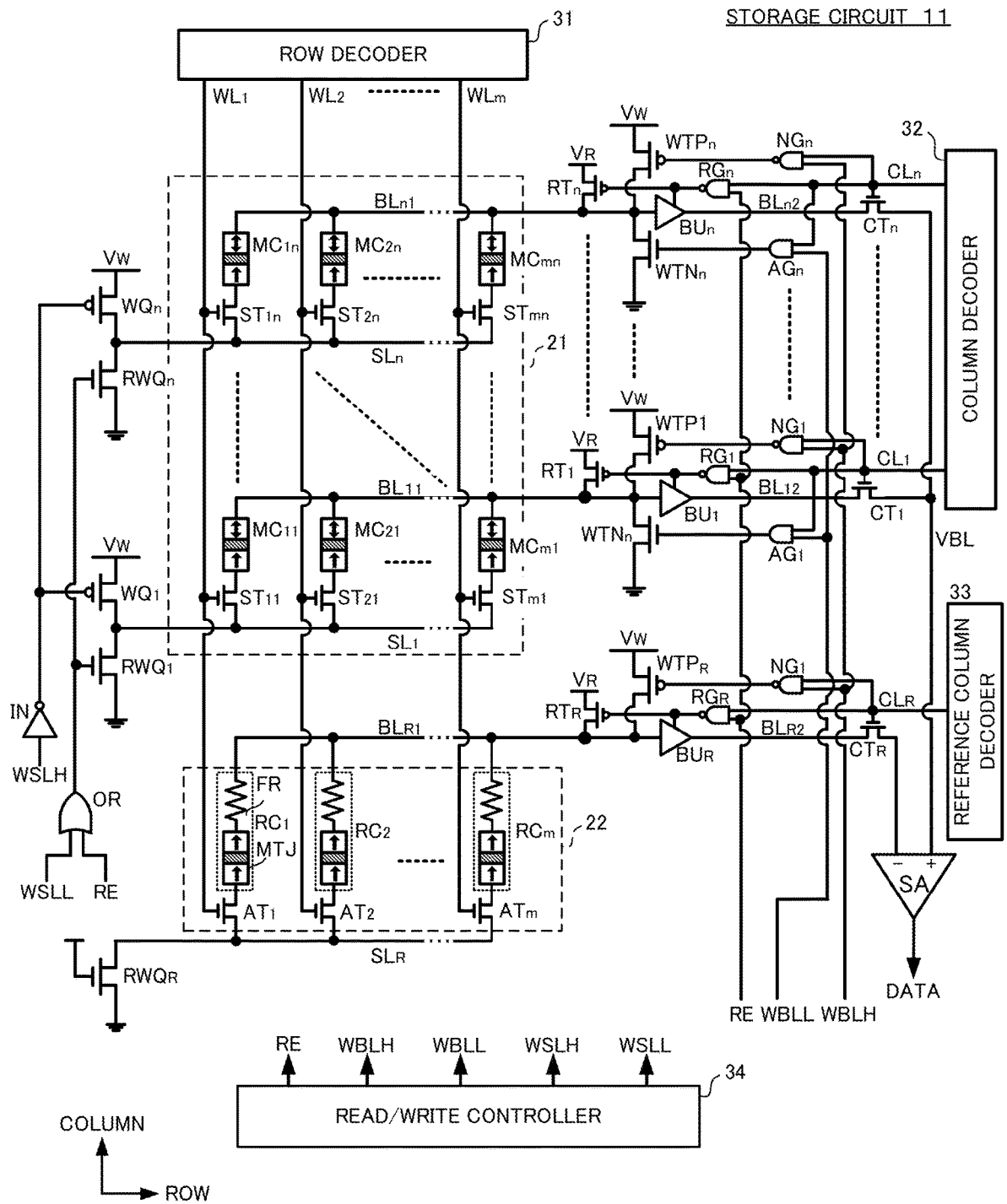
FIG. 1 is a block diagram of a storage circuit according to Embodiment 1 of the present disclosure.

In FIG. 1, a configuration of an m×n bit portion of a storage circuit 11 according to Embodiment 1 is illustrated.

As illustrated in FIG. 1, the storage circuit 11 includes a memory cell array 21 and a reference cell array 22.

The memory cell array 21 includes memory cells $MC_{ij}$ (i=1 to m and j=1 to n) arranged in a matrix of m rows and n columns. Each of m and n is a natural number.

In contrast, the reference cell array 22 includes reference cells $RC_i$ (i=1 to m) arranged in m rows and one column.

To one end of each memory cell $MC_{ij}$, one end of a current path of a selection transistor $ST_{ij}$ is connected. To one end of each reference cell $RC_i$, one end of a current path of a reference selection transistor $AT_i$ is connected.

Each of the selection transistors $ST_{ij}$ and each of the reference selection transistors $AT_i$ include N-channel MOS transistors, the drains of which are connected to the corresponding memory cell $MC_{ij}$ and the corresponding reference cell $RC_i$, respectively.

The other ends of memory cells $MC_{ij}$ in the j-th column are connected in common to a bit line $BL_j$ of the j-th column.

The other ends of the reference cells $RC_i$ are connected in common to a reference bit line $BL_R$.

The other ends of the current paths of selection transistors $ST_{ij}$ in the j-th column, which are respectively connected to the memory cells $MC_{ij}$ in the j-th column, are connected in common to a source line $SL_j$ arranged in the j-th column.

The other ends of the current paths of the reference selection transistors $AT_i$, which are respectively connected to the reference cell $RC_i$, are connected in common to a reference source line $SL_R$.

On the other hand, the gates of selection transistors $ST_{ij}$ and a reference selection transistor $AT_i$ in the i-th row are connected in common to a word line $WL_i$ in the i-th row.

The bit lines $BL_1$ to $BL_n$ include metal layers, such as aluminum layers or copper layers, that have substantially the same material, width, and thickness as one another. The bit lines $BL_j$ are connected in common to a vertical bit line VBL via analog buffer circuits (hereinafter, simply referred to as buffer circuits) $BU_j$ and current paths of column selection transistors $CT_j$.

The vertical bit line VBL extends in the column direction and is connected to a positive input terminal (+) of a sense amplifier SA. The vertical bit line VBL has a larger cross section than the bit lines $BL_1$ to $BL_n$ and a smaller resistance value per unit length than the bit lines $BL_j$. The positive input terminal (+) is an example of a first input terminal of the sense amplifier SA.

The reference cells $RC_1$ to $RC_m$ include MTJ elements and provide a reference resistance value at the time of read operation and are connected in common to the reference bit line $BL_R$. The reference bit line $BL_R$ includes a metal layer having substantially the same material, width, and thickness as those in the bit lines $BL_1$ to $BL_n$ and exhibits substantially the same electrical characteristics as the bit lines $BL_1$ to $BL_n$. The reference bit line $BL_R$ is connected to a negative input terminal (−) of the sense amplifier SA via a reference buffer circuit $BU_R$ and a current path of a reference column selection transistor $CT_R$. The negative input terminal (−) is an example of a second input terminal of the sense amplifier SA.

The column selection transistors $CT_1$ to $CT_n$ and the reference column selection transistor $CT_R$ have the same size and characteristics as one another.

In the following description, an input side portion and an output side portion of the buffer circuit $BU_j$ of each of the bit lines $BL_j$ are sometimes distinguished from each other as a first bit line $BL_{j1}$ and a second bit line $BL_{j2}$, respectively. In addition, an input side portion and an output side portion of the reference buffer circuit $BU_R$ of the reference bit lines $BL_R$ are sometimes distinguished from each other by referring to the input side portion and the output side portion as a first reference bit line $BL_{R1}$ and a second reference bit line $BL_{R2}$, respectively.

To the first bit line $BL_{j1}$ in the j-th column, one end of a current path of a read load transistor $RT_j$ is connected. To the other end of the current path of the read load transistor $RT_j$, read voltage $V_R$ is applied. The read load transistor $RT_j$ is a load transistor that functions as a load at the time of data read.

To the first bit line $BL_{j1}$ in the j-th column, one end of a current path of a write transistor $WTP_j$ and one end of a current path of a write transistor $WTN_j$ are further connected. To the other end of the current path of the write transistor $WTP_j$, write voltage $V_W$ is applied. In contrast, the other end of the current path of the write transistor $WTN_j$ is grounded. The write transistor $WTP_j$ includes a P-channel MOS transistor, and the write transistor $WTN_j$ includes an N-channel MOS transistor.

To the first reference bit line $BL_{R1}$ connected to the reference cells $RC_i$, one end of a current path of a reference read load transistor $RT_R$ is connected. To the other end of the current path of the reference read load transistor $RT_R$, the read voltage $V_R$ is applied. The reference read load transistor $RT_R$ is a load transistor that functions as a load at the time of data read and has the same size and characteristics as the read load transistors $RT_1$ to $RT_n$.

The first reference bit line $BL_{R1}$ and the reference read load transistor $RT_R$ function as a reference voltage conversion circuit to convert a resistance value of a reference cell $RC_i$ to a reference in cooperation with each other.

To each of the source lines $SL_j$, one end of a current path of a write transistor $WQ_j$ and one end of a current path of a read/write transistor $RWQ_j$ are connected. To the other end of the current path of the write transistor $WQ_j$, the write voltage $V_W$ is applied. In contrast, the other end of the current path of the read/write transistor $RWQ_j$ is grounded. The write transistor $WQ_j$ includes a P-channel MOS transistor and has the same size and characteristics as the write transistors $WTP_1$ to $WTP_n$. The read/write transistors $RWQ_j$ include N-channel MOS transistors and have the same size and characteristics as one another.

The reference source line $SL_R$ is grounded via a current path of a reference read transistor $RWQ_R$. The reference read transistor $RWQ_R$ includes an N-channel MOS transistor and has the same size and characteristics as the read/write transistors $RWQ_1$ to $RWQ_n$. The gate of the reference read transistor $RWQ_R$ is pulled up.

The word lines $WL_1$ to $WL_m$ are connected to a row decoder 31.

One ends of column lines $CL_1$ to $CL_n$ are connected to a column decoder 32.

The other end of each of the column lines $CL_j$ is connected to one input terminal of a NAND gate $RG_j$ in the same column. To the other input terminal of the NAND gate $RG_j$, a read enable signal RE is supplied. An output signal from the NAND gate $RG_j$ is output to the gate of the corresponding read load transistor $RT_j$ and an enable terminal of the corresponding buffer circuit $BU_j$. As a result, when reading is instructed by the read enable signal RE and a memory cells $MC_{ij}$ in the j-th column are selected by a column selection signal, the read load transistor $RT_j$ turns on and the buffer circuit $BU_j$ is brought to an enabled state, amplifies voltage of the first bit line $BL_{j1}$ one-fold, and outputs the amplified voltage to the second bit line $BL_{j2}$.

Each of the column lines $CL_j$ is connected to one input terminal of a NAND gate $NG_j$ in the same column. To the other input terminal of the NAND gate $NG_j$, a write control signal WBLH is supplied. The NAND gate $NG_j$ outputs a low-level output signal to the gate of the corresponding write transistor $WTP_j$ when both voltage of the column line $CL_j$ and the write control signal WBLH are at a high level.

Each of the column lines $CL_j$ is connected to one input terminal of an AND gate $AG_j$ in the same column. To the other input terminal of the AND gate $AG_j$, a write control signal WBLL is supplied. The AND gate $AG_j$ outputs a high-level output signal to the gate of the write transistor $WTN_j$ in the same column when both the voltage of the column line $CL_j$ and the write control signal WBLL are at the high level.

Each of the column lines $CL_j$ is further connected to the gate of the column selection transistor $CT_j$ in the same column. The column selection transistor $CT_j$ turns on when the j-th column is selected.

One end of a reference column line $CL_R$ is connected to a reference column decoder 33, and the other end of the reference column line $CL_R$ is connected to one input terminal of a reference NAND gate $RG_R$. To the other input terminal of the reference NAND gate $RG_R$, the read enable signal RE is supplied. The reference NAND gate $RG_R$ outputs an output signal to the gate of the reference read load transistor $RT_R$ and an enable terminal of the reference buffer circuit $BU_R$. As a result, the reference read load transistor $RT_R$ turns on and functions as a load when data read is instructed. In addition, the reference buffer circuit $BU_R$ is brought to an enabled state when data read is instructed.

The reference column line $CL_R$ is connected to one input terminal of a reference NAND gate $NG_R$. To the other input terminal of the reference NAND gate $NG_R$, the write control signal WBLH is supplied. The reference NAND gate $NG_R$ outputs a low-level output signal to the gate of a reference write transistor $WTP_R$ when both voltage of the reference column line $CL_R$ and the write control signal WBLH are at the high level.

The reference column line $CL_R$ is connected to the gate of the reference column selection transistor $CT_R$. Therefore, the reference column selection transistor $CT_R$ turns on when the reference column line $CL_R$ is at the high level.

To the gate of each of the write transistors $WQ_j$, which is connected to the source line $SL_j$ of the j-th column, a write control signal WSLH is applied via an inverter IN. Therefore, when the write control signal WSLH is at the high level, in other words, when "1" is to be written into a memory cell $MC_{ij}$, the write transistor $WQ_j$ turns on.

To the gate of each of the read/write transistors $RWQ_j$, which is connected to the source line $SL_j$ of the j-th column, an output terminal of an OR gate OR is connected. To one input terminal and the other input terminal of the OR gate OR, the read enable signal RE and a write control signal WSLL are supplied, respectively. When at least one of the read enable signal RE or the write control signal WSLL is at the high level, that is, at the time of reading or when "0" is to be written into a memory cell, the OR gate OR outputs a high-level signal and causes the read/write transistors $RWQ_1$ to $RWQ_n$ to turn on.

A read/write controller 34, in accordance with an instruction from a not-illustrated higher-level device, sets the read enable signal RE to the high level at the time of data read, sets the write control signals WBLH and WSLL to the high level at the time of writing data "0", and sets the write control signals WBLL and WSLH to the high level at the time of writing data "1".

The sense amplifier SA compares voltage at the positive input terminal with voltage of the reference bit line $BL_R$, and outputs a low-level DATA signal when the voltage at the positive input terminal is lower than voltage at the negative input terminal and outputs a high-level DATA signal when the voltage at the positive input terminal is higher than the voltage at the negative input terminal.

Each of the memory cells $MC_{ij}$ includes a magnetic tunneling junction (MTJ) element. The MTJ element includes three layers, namely a pinned (fixed) layer, an insulating layer, and a free layer. Magnetization direction of the pinned layer is fixed, and, even when current flows in the layer, the magnetization direction of the pinned layer does not change. In contrast, magnetization direction of the free layer can be changed, and, when current flows in the layer, the magnetization direction of the free layer changes. The insulation layer is a thin film disposed between the pinned layer and the free layer.

The MTJ element exhibits a low resistance value $R_p$ while the MTJ element is in a state where the magnetization directions of the pinned layer and the free layer point in the same direction as each other (parallel state) and exhibits a high resistance value $R_{ap}$ ($>R_p$) while the MTJ element is in a state where the magnetization directions of the pinned layer and the free layer point in the opposite directions to each other (antiparallel state).

In the present embodiment, the low resistance value and the high resistance value of the MTJ element are associated with data "0" and data "1", respectively.

Next, the reference cells $RC_i$ are described. Each of the reference cells $RC_i$ includes a series circuit of an MTJ element M and a fixed resistor FR. The MTJ element has the same structure (material, size, impurity concentration, and the like) as an MTJ element included in a memory cell $MC_{ij}$ and is set in a low resistance state (parallel state) where the magnetization directions of the pinned layer and the free layer point in the same direction as each other.

A resistance value $R_{offset}$ of the fixed resistor FR is set to a value that is greater than 0 and less than $R_{ap}-R_p$ ($=R_p \times MR$ ratio).

In addition, the MTJ element in each reference cell $RC_i$ is connected in such a way that, when read current flows, the low resistance state thereof is maintained. For example, at the time of reading, the voltage of the reference bit line $BL_R$ is set to be higher than that of the reference source line $SL_R$. In the configuration of the present embodiment, the free layer and the pinned layer are connected to the reference bit line $BL_{R1}$ and the reference source line $SL_R$ side, respectively.

Note that a read load transistor $RT_j$, a bit line $BL_j$, a selection transistor $ST_{ij}$, a source line $SL_j$, and a read/write transistor $RWQ_j$ function as a resistance-voltage conversion circuit that converts resistance of a memory cell $MC_{ij}$ to be accessed to voltage.

Figure 2A:
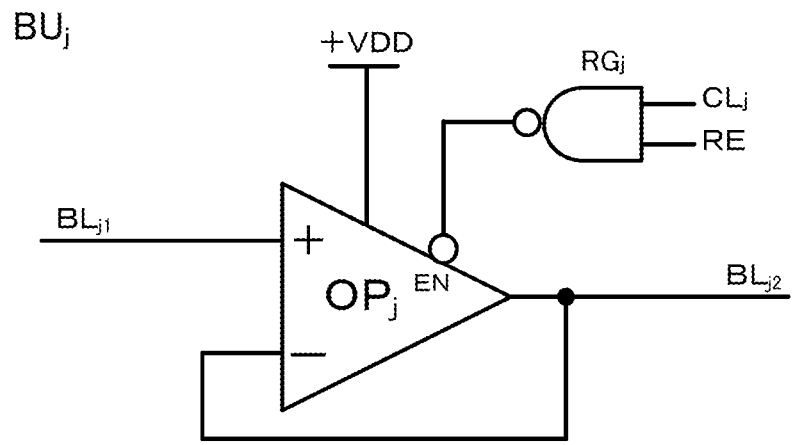
FIGS. 2A and 2B are circuit diagrams illustrating configurations of an analog buffer circuit and a reference buffer circuit illustrated in FIG. 1, respectively.

The buffer circuit $BU_j$ of the j-th column is an analog buffer circuit to buffer and output an input signal. More specifically, as illustrated in FIG. 2A, the buffer circuit $BU_j$ of the j-th column includes an amplifier circuit $OP_j$ to the positive input terminal (+) of which the first bit line $BL_{j1}$ of the j-th column is connected and the output terminal of which is connected to the second bit line $BL_{j2}$ and the negative input terminal (−), and amplifies input voltage one-fold and outputs the amplified voltage. The buffer circuit $BU_j$ of the j-th column has a higher current driving capability than current driving capability of the read load transistor $RT_j$. Note that the current driving capability, that is, driving capability, is capacity of how much current a circuit can pass to an output. The amplifier circuit $OP_j$ ideally has infinite input impedance and zero output impedance and also has an impedance conversion function. The amplifier circuit $OP_j$ is brought to an enabled state when an enable signal supplied to an enable terminal EN is at a low level, that is, when the storage circuit 11 is in a read mode and the corresponding j-th column is selected.

As illustrated in FIG. 1, the buffer circuit $BU_j$ of the j-th column has the input terminal thereof arranged at a position that is located on the sense amplifier SA side of a connection point between the first bit line $BL_{j1}$ and the read load transistor $RT_j$ of the j-th column and a connection point among the first bit line $BL_j$ and the write transistors $WTP_j$ and $WTN_j$ of the j-th column and that is in vicinities of the connection points. In addition, the output terminal of the buffer circuit $BU_j$ of the j-th column is connected to the positive input terminal of the sense amplifier SA via the second bit line $BL_{j2}$ and the vertical bit line VBL. In other words, the buffer circuit $BU_j$ of the j-th column is arranged between the load transistor $RT_j$, which is an example of the resistance-voltage conversion circuit, and the positive input terminal of the sense amplifier SA, which is an example of the first input terminal of the sense amplifier SA.

Figure 2B:
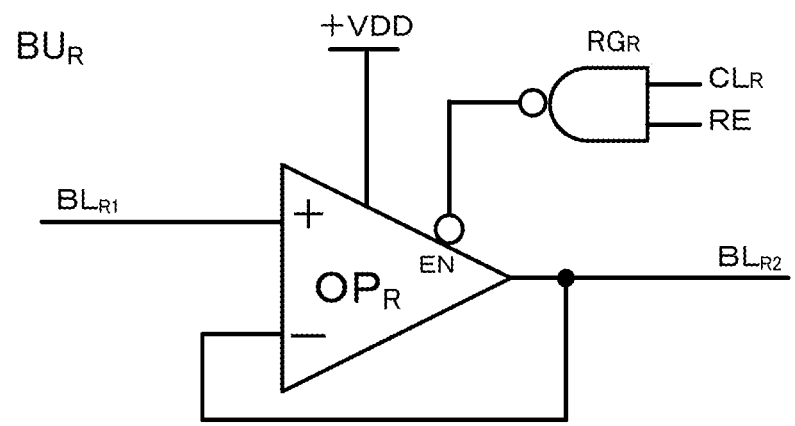

The reference buffer circuit $BU_R$ is an analog buffer circuit to buffer and output an input signal. More specifically, as illustrated in FIG. 2B, the reference buffer circuit $BU_R$ also includes an amplifier circuit $OP_R$ to the positive input terminal (+) of which the first reference bit line $BL_{R1}$ is connected, the output terminal of which is connected to the second reference bit line $BL_{R2}$ and the negative input terminal (−), and the amplification factor of which is set to one-fold. The reference buffer circuit $BU_R$ has a higher current driving capability than current driving capability of the reference read load transistor $RT_R$. The amplifier circuit $OP_R$ ideally has infinite input impedance and zero output impedance and also has an impedance conversion function. The amplifier circuit $OP_R$ is brought to an enabled state when an enable signal supplied to an enable terminal EN is at the low level, that is, when the storage circuit 11 is in the read mode and a reference cell RC is selected.

As illustrated in FIG. 1, the reference buffer circuit $BU_R$ has the input terminal thereof arranged at a position that is located on the sense amplifier SA side of a connection point between the first reference bit line $BL_{R1}$ and the reference read load transistor $RT_R$ and a connection point between the first reference bit line $BL_{R1}$ and the reference write transistor $WTP_R$ and that is in vicinities of the connection points. In addition, the output terminal of the reference buffer circuit $BU_R$ is connected to the negative input terminal of the sense amplifier SA via the reference bit line $BL_R$. In other words, the reference buffer circuit $BU_R$ is arranged between a reference circuit and the negative input terminal of the sense amplifier SA, which is an example of the second input terminal of the sense amplifier SA.

Next, operation of the storage circuit 11 having the configuration described above is described.

(Read Operation)

Read operation is described with reference to timing charts in FIGS. 3A to 3I.

A case where data is read from the memory cell $MC_{ij}$ in the i-th row and the j-th column is used as an example.

The column decoder 32 decodes a column address and, as illustrated in FIG. 3B, sets the column line $CL_j$ of the j-th column to the high level and maintains the other column lines CL at the low level at timing t1. In addition, as illustrated in FIG. 3B, the reference column decoder 33 sets the reference column line $CL_R$ to the high level.

Further, as illustrated in FIG. 3C, the read/write controller 34 sets the read enable signal RE to the high level at timing t1. As a result, both inputs of the NAND gate $RG_j$ of the j-th column are set to the high level, and, as illustrated in FIG. 3D, the output of the NAND gate $RG_j$ is set to the low level. As a result, the read load transistor $RT_R$ turns on. As a result, as illustrated in FIG. 3E, the bit line $BL_{j1}$ of the j-th column is charged with the read voltage $V_R$.

Likewise, both the voltage of the reference column line $CL_R$ and the read enable signal RE, which are two inputs to the reference NAND gate $RG_R$, are set to the high level at timing t1. Thus, as illustrated in FIG. 3D, the output of the reference NAND gate $RG_R$ is set to the low level, and the reference read load transistor $RT_R$ turns on. As a result, as illustrated in FIG. 3G, the reference bit line $BL_{j1}$ is once charged with the read voltage $V_R$.

In addition, the read enable signal RE being set to the high level causes the output of the OR gate OR to be set to the high level, which causes the read/write transistors $RWQ_1$ to $RWQ_n$ to turn on. As a result, the source line $SL_j$ of the j-th column is connected to a ground. Note that the reference read transistor $RWQ_R$ has the gate pulled up and is always in an on-state. As a result, the reference source line $SL_R$ is connected to the ground.

Succeedingly, the row decoder 31 decodes a row address and, as illustrated in FIG. 3A, sets the word line $WL_i$ of the i-th row to the high level and maintains the other word lines WL at the low level at timing t2. As a result, the selection transistor $ST_{ij}$ and the reference selection transistor $AT_i$ turn on.

The selection transistor $ST_{ij}$ turning on causes current to flow from the read load transistor $RT_j$ to the first bit line $BL_{j1}$, to the memory cell $MC_{ij}$, to the source line $SL_j$, to the read/write transistor $RWQ_j$, and to the ground, and, as illustrated in FIG. 3E, voltage (data voltage) $V_{b1}$ of the first bit line $BL_{j1}$ of the j-th column changes to a voltage corresponding to a resistance value of the memory cell $MC_{ij}$. Specifically, when the resistance value of the MTJ element included in the memory cell $MC_{ij}$, is a high resistance (stored data are "1"), the voltage $V_{b1}$ changes to a comparatively high voltage, and, when the resistance value of the MTJ element is a low resistance (stored data are "0"), the voltage $V_{b1}$ changes to a comparatively low voltage.

The first bit line $BL_{ij}$ of the j-th column is connected to the input terminal of the buffer circuit $BU_j$, which has a large input impedance. Thus, a portion of the first bit line $BL_{j1}$ that is charged by the read load transistor $RT_j$ is short and has a sufficiently small wiring capacitance compared with a conventional case where the entire bit line $BL_j$ including the vertical bit line VBL is charged. Thus, speed of change in the voltage of the first bit line $BL_{j1}$ of the j-th column is higher than in the conventional case.

As illustrated in FIG. 3D, when the output of the NAND gate $RG_j$ is set to the low level at timing t1, the buffer circuit $BU_j$ is brought to the enabled state and outputs a data voltage $V_{b2}$, which is the same as a data voltage $V_{b1}$ of the first bit line $BL_{j1}$, to the second bit line $BL_{j2}$. The current driving capability of the buffer circuit $BU_j$ is higher than the current driving capability of the read load transistor $RT_j$. Therefore, although wiring capacitance of the second bit line $BL_{j2}$ and the vertical bit line VBL is comparatively large, the buffer circuit $BU_j$ is capable of charging the second bit line $BL_{j2}$ and the vertical bit line VBL at high speed and, as illustrated in FIGS. 3E and 3F, causing the voltage $V_{b2}$ of the vertical bit line VBL to follow the data voltage $V_{b1}$ of the first bit line $BL_{j1}$. The voltage $V_{b2}$ of the vertical bit line VBL is supplied to the positive input terminal of the sense amplifier SA.

When the word line $WL_i$ of the i-th row is set to the high level and the reference selection transistor $AT_i$ turns on at timing t2, current flows from the reference read load transistor $RT_R$ to the first reference bit line $BL_{R1}$, to the reference cell $RC_i$, to the reference selection transistor $AT_i$, to the reference source line $SL_R$, to the reference read transistor $RWQ_R$, and to the ground. Therefore, voltage of the first reference bit line $BL_{R1}$ changes to a reference voltage $V_{ref1}$, as illustrated in FIG. 3G.

The reference buffer circuit $BU_R$ was brought to the enabled state at timing t1, and the reference buffer circuit $BU_R$ thus outputs a reference voltage $V_{ref2}$, which is the same as the reference voltage $V_{ref1}$ of the first reference bit line $BL_{R1}$. Since the reference buffer circuit $BU_R$ has a large current driving capability, the reference buffer circuit $BU_R$ is capable of charging the second reference bit line $BL_{R2}$ and a vertical bit line $VBL_R$ at high speed and causing the reference voltage $V_{ref2}$ to follow change in the reference voltage $V_{ref1}$ of the first reference bit line $BL_{R1}$, as illustrated in FIG. 3H.

The sense amplifier SA outputs a high-level output signal DATA when the data voltage $V_{b2}$ of the vertical bit line VBL, which is applied to the positive input terminal, is higher than the reference voltage $V_{ref2}$, which is applied to the negative input terminal, and outputs a low-level output signal DATA when the data voltage $V_{b2}$ of the vertical bit line VBL is lower than the reference voltage $V_{ref2}$, as illustrated in FIG. 3I. Performing signal processing with "1" and "0" representing the high level and the low level, respectively, causes stored data in the memory cell $MC_{ij}$ in the i-th row and the j-th column to be read.

Subsequently, the word line $WL_i$, the read enable signal RE, and the column lines $CL_j$ and $CL_R$ are successively set to the low level, and one read cycle is terminated.

Note that, in the read operation, the write control signals WBLH, WBLL, WSLH, and WSLL are maintained at the low level.

(Write Operation)

When data are written into the memory cell $MC_{ij}$ in the i-th row and the j-th column, the column decoder 32 decodes the column address and, as illustrated in FIGS. 4B and 5B, sets the column line $CL_j$ of the j-th column to the high level and maintains the other column lines CL at the low level.

On the other hand, the read/write controller 34 controls the write control signals WBLH, WBLL, WSLH, and WSLL according to the write data.

Since, in a write mode, the read enable signal RE is at the low level, the NAND gates $RG_j$ and $RG_R$ output high-level signals. Thus, the read load transistors $RT_j$ and $RT_R$ turn off, and the buffer circuits $BU_j$ and $BU_R$ are brought to a disabled state and do not operate. Therefore, there is no chance that write current flows into the second bit lines $BL_{j2}$ and the vertical bit line VBL.

First, operation in the case of writing "0" is described.

The read/write controller 34 sets the write control signals WBLH and WSLL to the high level, as illustrated in FIG. 4C, and maintains the write control signals WBLL and WSLH at the low level, as illustrated in FIG. 4D. As a result, the output of the write NAND gate $NG_j$ of the j-th column is set to the low level, and the write transistor $WTP_j$ turns on. As a result, as illustrated in FIG. 4E, the first bit line $BL_{j1}$ of the j-th column is brought to the write voltage. Since the first bit line $BL_{j1}$ is comparatively short, the time required for charging is a short period of time.

On the other hand, the write control signal WSLL being set to the high level causes the output of the OR gate OR to be set to the high level, which causes the read/write transistor $RWQ_j$ to turn on, as a result of which, as illustrated in FIG. 4F, the source line $SL_j$ is grounded.

Succeedingly, the row decoder 31 decodes the row address and, as illustrated in FIG. 4A, sets the word line $WL_i$ of the i-th row to the high level and causes the selection transistor $ST_{ij}$ to turn on. Then, the selection transistor $ST_{ij}$ turning on causes current to flow from the write transistor $WTP_j$ to the first bit line $BL_{j1}$ of the j-th column, to the memory cell $MC_{ij}$, to the source line $SL_j$, to the read/write transistor $RWQ_j$, and to the ground. As a result, the MTJ element included in the memory cell $MC_{ij}$ is set to the parallel state, and the resistance value of the MTJ element changes to a low resistance. In other words, data "0" are written.

Next, operation in the case of writing data "1" is described.

In this case, the read/write controller 34 sets the write control signals WBLL and
WSLH to the high level, as illustrated in FIG. 5D, and maintains the write control signals WBLH and WSLL at the low level, as illustrated in FIG. 5C. As a result, the output of the AND gate $AG_j$ of the j-th column is set to the high level, and the write transistor $WTN_j$ turns on.

On the other hand, the write control signal WSLH being set to the high level causes the output of the inverter IN to be set to the low level, which causes the write transistor $WQ_j$ to turn on, as a result of which, as illustrated in FIG. 5F, the write voltage $V_W$ is applied to the source line $SL_j$.

Succeedingly, the row decoder 31 decodes the row address and, as illustrated in FIG. 5A, sets the word line $WL_i$ of the i-th row to the high level and causes the selection transistor $ST_{ij}$ to turn on. As a result, current flows from the write transistor $WQ_j$ to the source line $SL_j$, to the memory cell $MC_{ij}$, to the first bit line $BL_{j1}$ of the j-th column, to the write transistor $WTN_j$, and to the ground. The current flows through the MTJ element included in the memory cell $MC_{ij}$, the MTJ element is set to the anti-parallel state, and the resistance value of the MTJ element changes to a high resistance. In other words, data "1" are written.

Subsequently, the word line $WL_i$, the column line $CL_j$, the write control signal WBLL, and the write control signal WSLH are successively set to the low level, and one cycle of write processing is terminated.

(Data Writing into Reference Cell $RC_i$)

Into the reference cells, only data "0" are written.

Writing methods include a method of applying a magnetic field from the outside and a method using write current.

A method for setting the reference cells RC to the low resistance state (parallel state) by passing write current through the reference cells RC is described below.

First, the reference column decoder 33 sets the reference column line $CL_R$ to the high level. On the other hand, the read/write controller 34 sets the write control signal WBLH to the high level. As a result, the reference NAND gate $NG_R$ outputs a low-level signal. As a result, the reference write transistor $WTP_R$ turns on.

On the other hand, the row decoder 31 sets the word line $WL_1$ to the high level and sets the other word lines WL to a ground level. As a result, the reference selection transistor $AT_1$ turns on.

Then, current flows from the reference write transistor $WTP_R$ to the reference bit line $BL_{R1}$, to the reference cell $RC_1$, to the reference selection transistor $AT_1$, to the reference source line $SL_R$, to the reference read transistor $RWQ_R$, and to the ground. As a result, current flows through the MTJ element included in the reference cell $RC_1$, a free layer MF of the MTJ element is magnetized in the same direction as a pinned layer MP of the MTJ element, and resistance across the MTJ element changes to the low resistance $R_p$.

The row decoder 31 sets the word line $WL_1$ to the low level and the word line $WL_2$ to the high level when the writing of data "0" into the reference cell $RC_1$ is completed. Subsequently, by selecting the reference selection transistors $AT_3$ to $AT_m$ in a sequential manner, current is passed through the reference cells $RC_2$ to $RC_m$ in a sequential manner and data "0" are written into the MTJ elements.

In this manner, data "0" can be written into all the reference cells $RC_1$ to $RC_m$.

As described in the foregoing, in the storage circuit 11 according to the present embodiment, a buffer circuit is arranged in each bit line BL. Thus, a portion that the read load transistor $RT_j$ is required to charge at the time of data read is only a first bit line $BL_{j1}$ portion, which is relatively short. Therefore, the read load transistor $RT_j$ can charge the wiring capacitance of the first bit line $BL_{j1}$ at high speed and thereby establish the data voltage $V_{b1}$.

The buffer circuit $BU_j$ has a larger current driving capability than the read load transistor $RT_j$. Thus, the buffer circuit $BU_j$ is capable of charging the second bit line $BL_{j2}$ and the vertical bit line VBL at higher speed than in the case of charging the second bit line $BL_{j2}$ and the vertical bit line VBL with current that has passed the read load transistor $RT_j$. Therefore, the buffer circuit $BU_j$ can establish the voltage $V_{b2}$ at the positive input terminal of the sense amplifier SA in a shorter period of time than in the conventional case. Therefore, it is possible to read data at high speed.

The reference voltage $V_{ref2}$, which is applied to the negative input terminal of the sense amplifier SA, can also be established in a short period of time.

In addition, it is possible to prevent write current from sneaking into the vertical bit line VBL, improve write speed, and further suppress leakage current and thereby suppress power consumption.

Figure 6A:
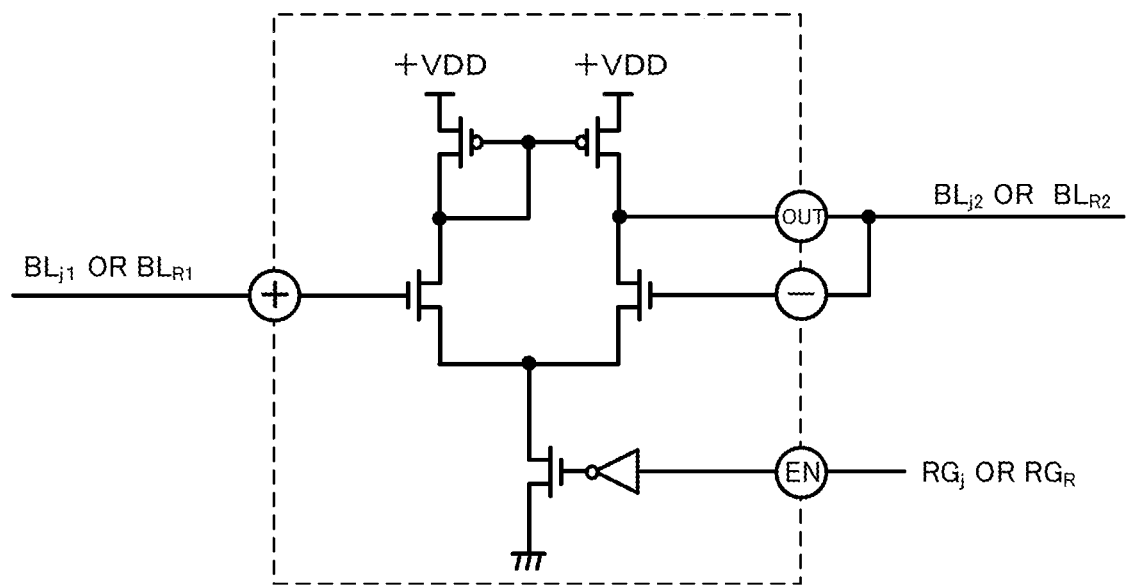
FIGS. 6A and 6B are respectively circuit diagrams illustrating circuit examples of the analog buffer circuit and the reference buffer circuit illustrated in FIG. 1.
Figure 6B:
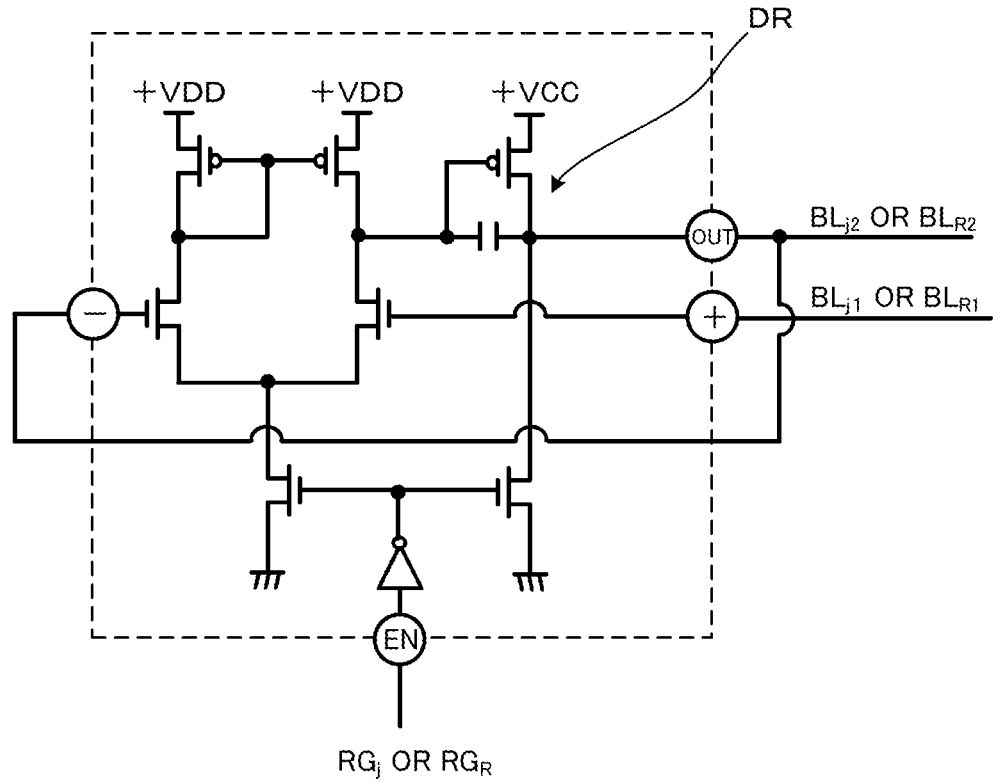

Specifically, the buffer circuits $BU_j$ and $BU_R$ includes, for example, an amplifier circuit including a known transistor circuit illustrated in FIGS. 6A and 6B.

Each transistor included in the amplifier illustrated in FIG. 6A includes a MOS transistor that has a larger current driving capability than a read load transistor RT, such as a transistor having a large channel width, and the entire circuit also has a large current driving capability. The positive input terminal is connected to the gate of a MOS transistor, and the input impedance is thus extremely high.

The amplifier illustrated in FIG. 6B includes the amplifier illustrated in FIG. 6A and an output stage (driving stage) DR. In the case of this configuration, the output stage DR includes a MOS transistor that has a larger current driving capability than a read load transistor RT, such as a transistor having a large channel width, and the entire circuit also has a larger current driving capability than a read load transistor RT.

Power-supply voltage VDD to be supplied to the buffer circuits $BU_j$ may be a voltage different from the read voltage $V_R$. In FIG. 6B, the power-supply voltages VDD and VCC may be different from each other.

Although, in FIGS. 6A and 6B, buffer circuits having characteristics that an amplification factor is one-fold, that is, input voltage Vin is equal to output voltage Vout, were illustrated as examples, the buffer circuits are not limited thereto. Any buffer circuit with whatever input/output characteristics may be used as long as such a buffer circuit does not have adverse effects on comparison between the data voltage $V_{b1}$ and the reference voltage $V_{ref1}$ in the sense amplifier SA.

Figure 7A:
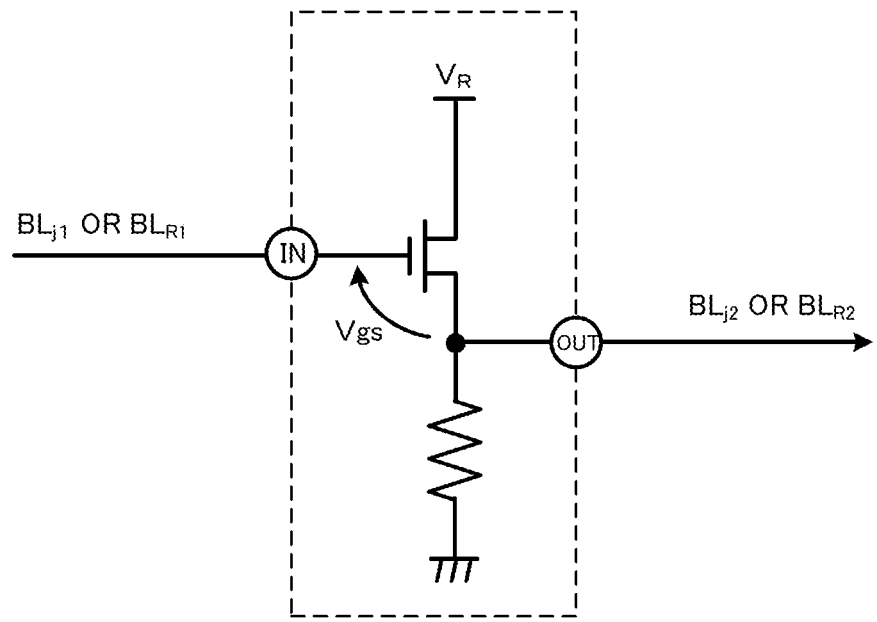
FIGS. 7A and 7B are respectively circuit diagrams illustrating other circuit examples of the analog buffer circuit and the reference buffer circuit illustrated in FIG. 1.
Figure 7B:
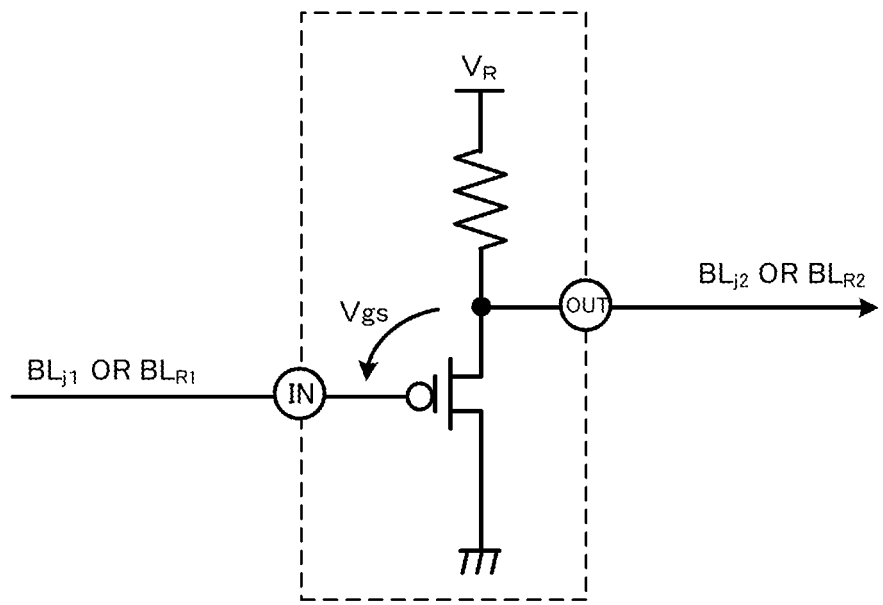

For example, as a buffer circuit BU, an NMOSFET source follower circuit exemplified in FIG. 7A or a PMOSFET source follower circuit exemplified in FIG. 7B can be used. A source follower circuit has characteristics that Vout=Vin−Vgs. In the above equation, Vgs denotes voltage at the gate with respect to the source.

A case is assumed where, in the circuit configuration illustrated in FIG. 1, a source follower circuit illustrated in FIG. 7A or 7B is used as the buffer circuits $BU_j$ and the reference buffer circuit $BU_R$. In this case, a difference $\Delta V_{read}$ between voltage applied to the positive input terminal of the sense amplifier SA and voltage applied to the negative input terminal of the sense amplifier SA is expressed by the equation (1):

$$\begin{aligned}\Delta V_{read} &= V_{b2} - V_{ref2}\\&= (V_{b1} - Vgs) - (V_{ref1} - Vgs).\\&= V_{b1} - V_{ref1}\end{aligned} \quad (1)$$

As described above, influence of the gate-source voltage Vgs is canceled out between two buffer circuits, namely a buffer circuit $BU_j$ and the buffer circuit $BU_R$, and the sense amplifier SA is able to output an appropriate signal DATA.

Although, in the configuration in FIG. 1, the buffer circuit $BU_R$ is arranged in the reference bit line $BL_R$, no buffer circuit has to be arranged in the reference bit line $BL_R$ when the wiring capacitance of the reference bit line $BL_R$ is small and signal delay is negligible. Likewise, no buffer circuit has to be disposed in a bit line BL located in a vicinity of the sense amplifier SA. From which column onward a buffer circuit BU is disposed can be arbitrarily set.

Figure 8A:
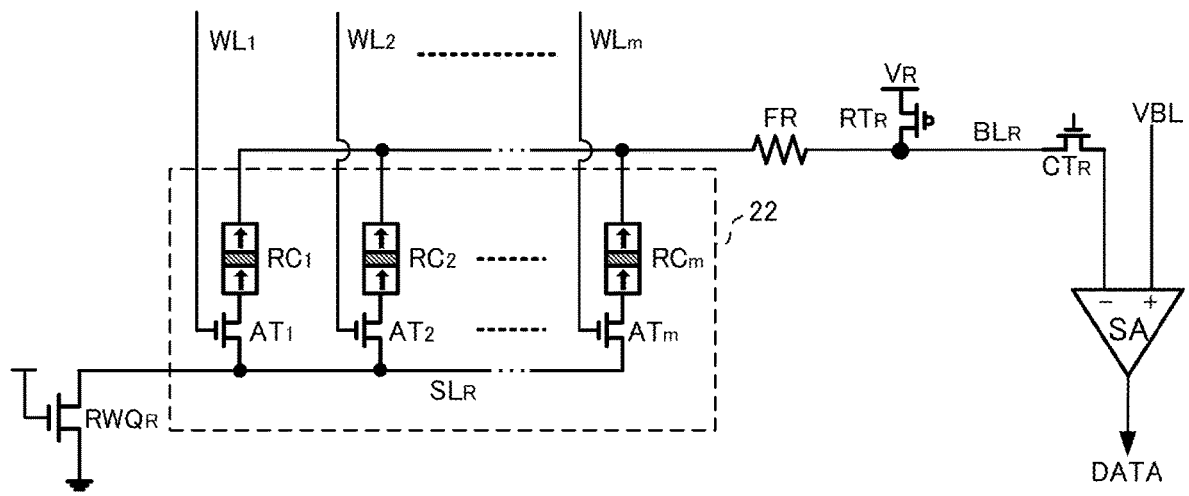
FIGS. 8A and 8B are diagrams illustrating variations of a reference circuit in the storage circuit.
Figure 8B:
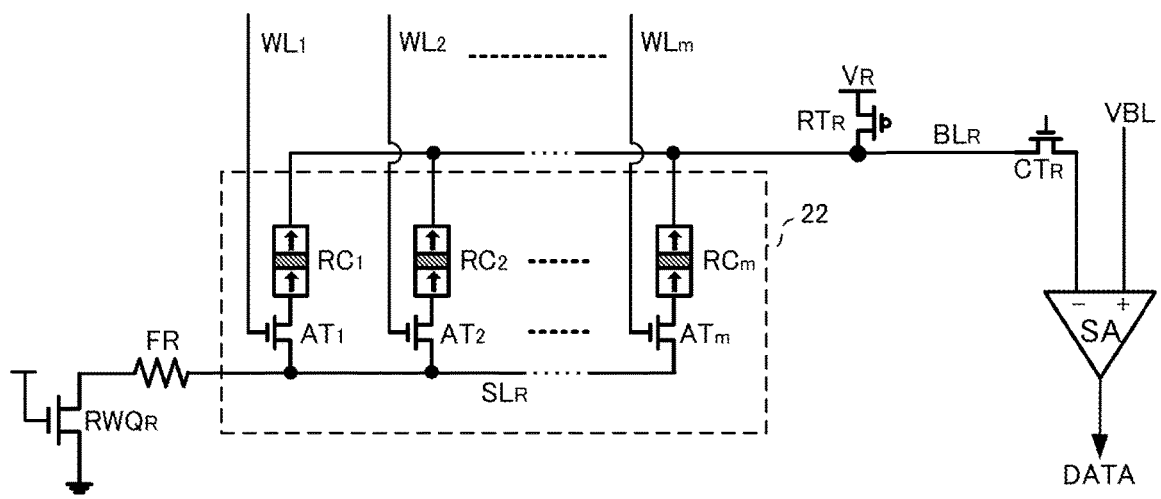

Although, in the configuration in FIG. 1, each reference cell $RC_i$ includes a fixed resistor FR and an MTJ element, a fixed resistor FR can be arranged in such a manner as to be shared by a plurality of reference cells $RC_i$, as illustrated in FIGS. 8A and 8B.

Although, in the embodiments described above, data "0" and data "1" are assigned to the low and high resistances of an MTJ element, respectively, data "1" and data "0" may be assigned to the low and high resistances of an MTJ element, respectively.

In the above description, each of the memory cells $MC_{ij}$ including an MTJ element is connected to a first signal line that is connected to the read load transistor $RT_j$ and the input terminal of the buffer circuit $BU_j$, and each of the selection transistors $ST_{ij}$ is connected to a second signal line that is connected to the write transistor $WQ_j$ and the read/write transistor $WRQ_j$. Thus, the first signal line and the second signal line are referred to as a bit line $BL_{ij}$ and a source line $SL_{ij}$, respectively. However, the selection transistor $ST_{ij}$ and the memory cell $MC_{ij}$ may be connected to the first signal line and the second signal line, respectively. In this case, the first signal line and the second signal line serve as a source line and a bit line, respectively. In this case, read current flows from the read load transistor $RT_j$ to the source line $SL_j$, to the selection transistor $ST_{ij}$, to the memory cell $MC_{ij}$, to the bit line $BL_{ij}$, to the read/write transistor $WRQ_j$, and to the ground. Likewise, each of the reference cells $RC_i$ is connected to a first reference signal line that is connected to the reference read load transistor $RT_R$, and each of the reference selection transistors $AT_i$ is connected to a second reference signal line that is connected to the reference read transistor $RWQ_R$. Thus, the first reference signal line and the second reference signal line are referred to as the reference bit line $BL_R$ and the reference source line $SL_R$, respectively. However, the reference selection transistor $AT_i$ and the reference cell $RC_i$ may be connected to the first reference signal line and the second reference signal line, respectively. In this case, the first reference signal line and the second reference signal line serve as the reference source line and the reference bit line, respectively. In addition, the name of a signal line, the name of a transistor, and the like can be arbitrarily defined. This applies to the following description.

The current driving capability of a buffer circuit $BU_j$ is determined, for example, in the following manner.

The read current passed through a memory cell $MC_{ij}$ is set to ½ or less of a minimum value of the write current in order not to induce a read disturb malfunction. The above "write current" means current that allows stored data in a memory cell $MC_{ij}$ to be rewritten by keeping passing the current through the memory cell $MC_{ij}$ during a preset write time TW. Although, theoretically, if a condition that the minimum value of the write current is greater than the read current is satisfied, no read disturb can occur, the read current is set in a manner as described above in order to maintain margin for fluctuation of various factors, such as variation in voltage, temperature, and a production process. The current driving capability of a buffer circuit $BU_j$ is selected in such a way that, by passing current, the current being larger than current that flows through the vertical bit line VBL without the buffer circuit $BU_j$ disposed, while maintaining a condition that the read current passed through a memory cell $MC_{ij}$ is less than or equal to ½ of the minimum value of the write current, the vertical bit line VBL can be charged at high speed.

Embodiment 2

In Embodiment 1, all the buffer circuits $BU_j$ and $BU_R$ were assumed to have the same size. In Embodiment 1, the second bit lines $BL_{j2}$ of the respective columns have the same length and substantially the same wiring capacitance. In addition, the vertical bit line VBL is used by all the columns in a shared manner. Therefore, wiring capacitances to be charged by the respective buffer circuits $BU_j$ are the same as one another. However, effective wiring capacitances to be charged in order to establish input voltage at the positive input terminal of the sense amplifier SA are different from one another for each column. For example, in FIG. 1, wiring capacitance that the buffer circuit $BU_n$ of the n-th column is required to charge in order to establish the voltage at the positive input terminal of the sense amplifier SA is larger than wiring capacitance that the buffer circuit $BU_1$ of the first column is required to charge in order to establish the voltage at the positive input terminal of the sense amplifier SA.

Figure 9:
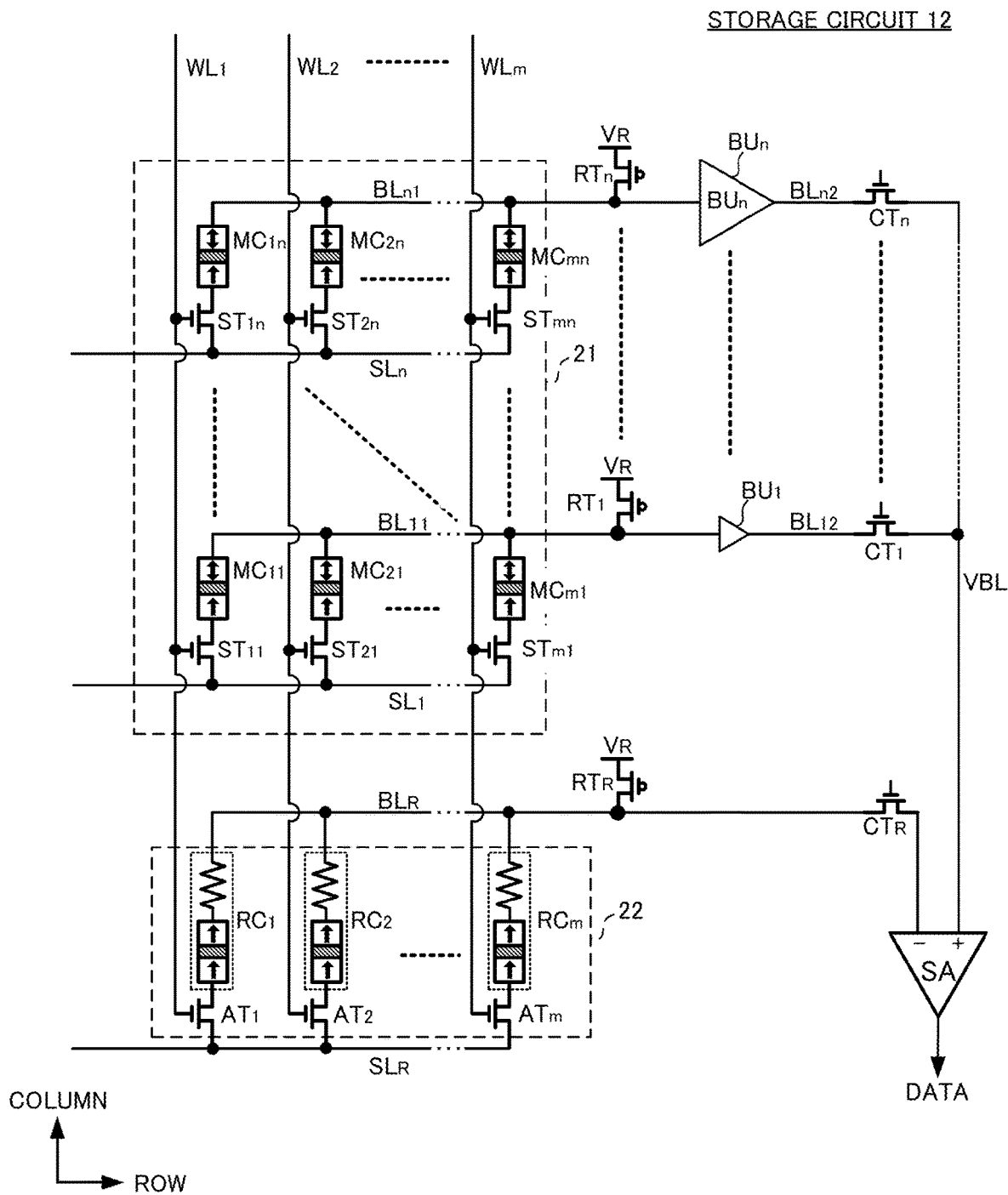
FIG. 9 is a block diagram of a main part of a storage circuit according to Embodiment 2.

Focusing on this point, it may be configured such that, as schematically illustrated in FIG. 9, current driving capability of a buffer circuit $BU_j$ is differentiated from the others for each column.

In a storage circuit 12 in FIG. 9, the current driving capability of the buffer circuits $BU_j$ diminishes in the order of the n-th column, the (n−1)-th column, . . . , and the first column. Note that, in FIG. 9, the current driving capability is indicated by size of a triangle representing a buffer circuit BU. In addition, no buffer circuit is arranged in a reference bit line $BL_R$.

Figure 10:
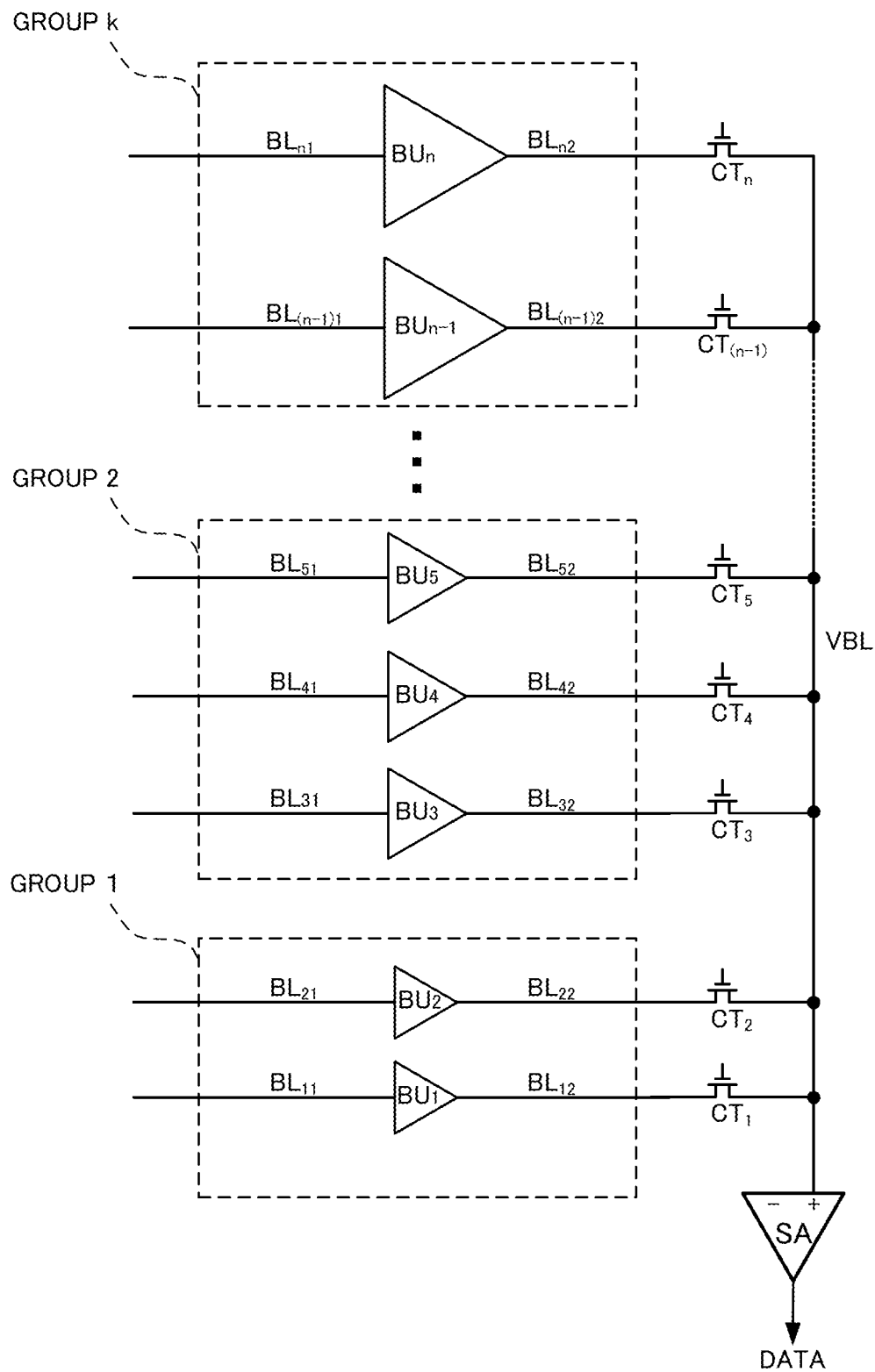
FIG. 10 is a block diagram of a main part of a storage circuit according to another example of Embodiment 2.

Further, it may be configured such that, as illustrated in FIG. 10, one or a plurality of successive columns is grouped into a group and the current driving capability of the buffer circuits BU is differentiated for each group. The numbers of columns belonging to individual groups may be the same or different from one another.

In the example in FIG. 10, two columns belong to a first group, three columns belong to a second group, . . . , and two columns belong to a k-th group, and, as the group number increases, the current driving capability of a buffer circuit $BU_j$ increases. Note that, in the same group, the current driving capabilities of buffer circuits $BU_j$ are the same. Note also that the configuration in FIG. 9 is equivalent to a configuration in which all the groups include one column.

The configuration as described above enables read operation to be speeded up, power consumption to be suppressed, and increase in a footprint to be suppressed.

An arbitrary method for adjusting or differentiating the current driving capability of the buffer circuits BU may be used.

For example, 1) a method of using buffer circuits BU having the same configuration and differentiating power-supply voltage VDD, 2) a method of, although using buffer circuits BU having the same circuit configuration, differentiating size (in particular, channel width) of transistors included in the buffer circuits BU, 3) a method of differentiating a circuit configuration for each buffer circuit, 4) a method of differentiating the number of buffer circuits connected in parallel, 5) a combination of these methods, or the like can be employed.

Embodiment 3

Figure 11:
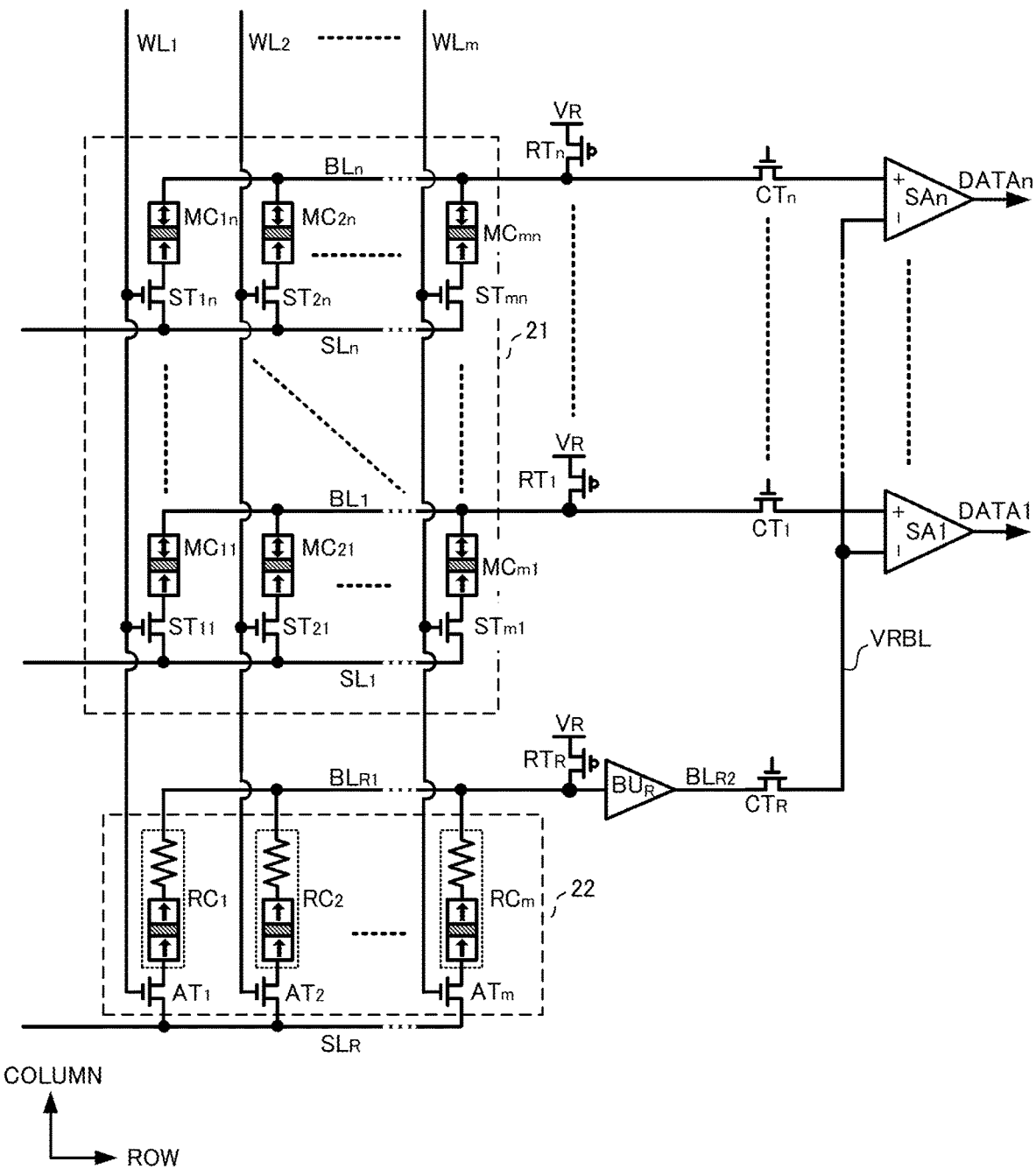
FIG. 11 is a block diagram of a main part of a storage circuit according to Embodiment 3.

Although, in Embodiments 1 and 2, one sense amplifier SA was arranged for the entire memory cell array, a configuration in which a sense amplifier is arranged for each column in a memory cell array as disclosed in International Publication No. WO 2019/112068 can also be employed. In FIG. 11, a main part of a storage circuit 13 having such a configuration is illustrated.

As illustrated in FIG. 11, in the present embodiment, a sense amplifier SA is arranged for each column of a memory cell array 21.

A bit line $BL_j$ of the j-th column is connected to a positive input terminal of a sense amplifier SA of the j-th column via a current path of a column selection transistor $CT_j$.

In contrast, in a reference bit line $BL_R$, a buffer circuit $BU_R$ is arranged. In the following description, as with Embodiment 1, reference bit lines connected to an input terminal and an output terminal of the buffer circuit $BU_R$ are referred to as a first reference bit line $BL_{R1}$ and a second reference bit line $BL_{R2}$, respectively. The second reference bit line $BL_{R2}$ is connected to a vertical reference bit line VRBL, which is arranged for sense amplifiers SA1 to SAn in common.

The buffer circuit $BU_R$ has a larger current driving capability than any one of read load transistors $RT_1$ to $RT_n$.

The vertical reference bit line VRBL extends in the column direction and is connected to negative input terminals of the sense amplifiers SA1 to SAn.

Read operation of the storage circuit 13 is described. Note that basic operation is the same as the read operation in the storage circuit 11 of Embodiment 1 and the following description is made mainly on differences.

An example in which data is read from a memory cell $MC_{ij}$ in the i-th row and the j-th column is described.

First, when the j-th column is selected and the read load transistor $RT_j$ turns on, the bit line $BL_j$ of the j-th column is charged with read voltage $V_R$. At the same time, a reference read load transistor $RT_R$ turns on. As a result, the first reference bit line $BL_{R1}$ is charged with the read voltage $V_R$.

Succeedingly, not-illustrated read/write transistors $RWQ_1$ to $RWQ_n$ turn on.

Succeedingly, a word line $WL_i$ of the i-th row is set to a high level and a selection transistor $ST_{ij}$ and a reference selection transistor $AT_i$ turn on.

Then, read current flows from the read load transistor $RT_j$ to the bit line $BL_j$, to the memory cell $MC_{ij}$, to a source line $SL_j$, to the read/write transistor $RWQ_j$, and to a ground. As a result, voltage (data voltage) $V_b$ of the bit line $BL_j$ of the j-th column changes to a voltage $V_b$ corresponding to a resistance value of the memory cell $MC_{ij}$. In the configuration in FIG. 11, no vertical bit line is arranged and the bit lines $BL_j$ are comparatively short. Therefore, the data voltage $V_b$ propagates to the positive input terminal of a sense amplifier SA in a short period of time.

At the same time, the selection transistor $AT_i$ turning on causes reference current to flow from the reference read load transistor $RT_R$ to the bit line $BL_{R1}$, to the reference cell $RC_i$, to a source line $SL_R$, to a reference read transistor $RWQ_R$, and to the ground. The first reference bit line $BL_{R1}$ is relatively short and is charged in a short period of time, and voltage of the first reference bit line $BL_{R1}$ changes to a reference voltage $V_{ref1}$ in a short period of time.

At the same time as the reference read load transistor $RT_R$ turns on, the reference buffer circuit $BU_R$ is brought to an enabled state. Since the reference buffer circuit $BU_R$ has a high current driving capability, the reference buffer circuit $BU_R$ is capable of rapidly charging the second reference bit line $BL_{R2}$ and the vertical reference bit line VRBL and supplying the negative input terminal of the sense amplifier SAj of the j-th column with a reference voltage $V_{ref2}$ in a short period of time. Therefore, it is possible to prevent a situation in which it takes time to transmit the reference voltage $V_{ref2}$ to the sense amplifier that is located away from the reference circuit and read speed is thereby limited.

Embodiment 4

Although, in Embodiment 3, an example in which the entire vertical reference bit line VRBL is rapidly charged was described, effective length of a vertical reference bit line VRBL that is required to be charged is different between when the first column is accessed and when the n-th column is accessed. For example, while, when a memory cell $MC_{j1}$ in the first column is accessed, only wiring capacitance in a distance to a negative input terminal of a sense amplifier SA1 within the vertical reference bit line VRBL is required to be charged, when a memory cell $MC_{in}$ in the n-th column is accessed, wiring capacitance of substantially the whole of the vertical reference bit line VRBL is required to be charged. Thus, as with Embodiment 2, driving capability of a buffer circuit $BU_R$ may be adjusted according to a column to be accessed in order to suppress power consumption.

Figure 12A:
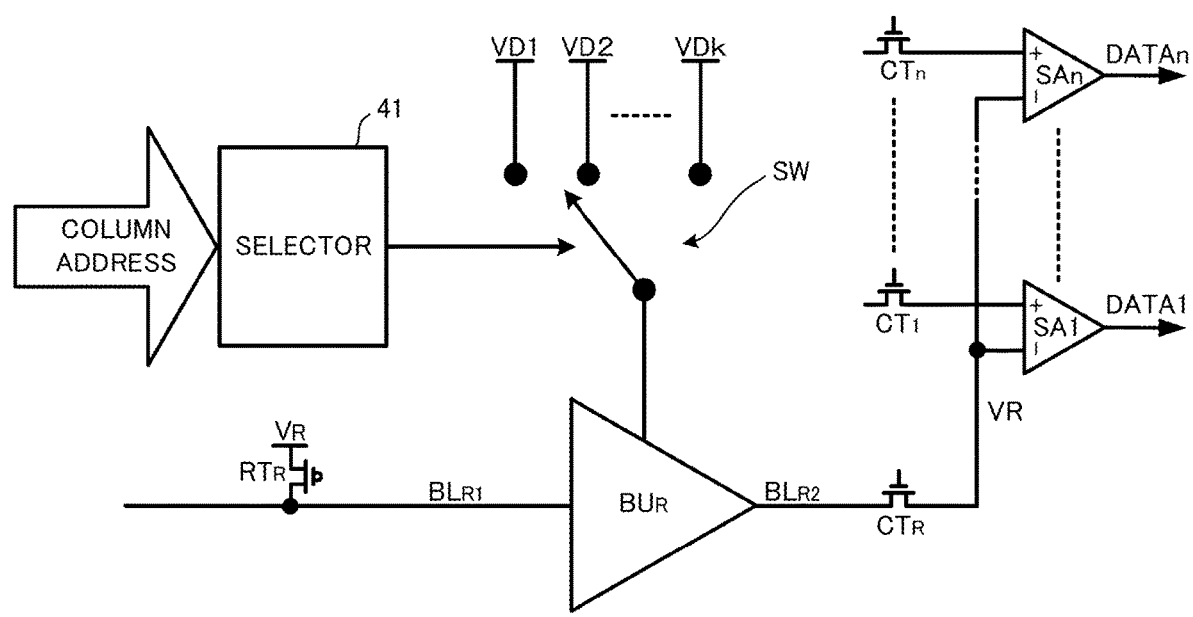
FIGS. 12A and 12B are respectively block diagrams of a main part of an analog buffer circuit in a storage circuit according to Embodiment 4.

FIG. 12A exemplifies a configuration in which current driving capability of one buffer circuit $BU_R$ is changed according to a column to be accessed. In FIG. 12A, power-supply voltages VD1 to VDk are prepared as power-supply voltage of the buffer circuit $BU_R$. VDk> . . . >VD2>VD1 holds.

A selector 41 decodes a column address, and selects the voltage VD1 by use of a switch SW when a column belonging to a first group that is closest to a reference circuit is to be accessed, selects the voltage VD2 by use of the switch SW when a column belonging to a second group that is second closest to the reference circuit is to be accessed, . . . , and selects the voltage VDk by use of the switch SW when a column belonging to a k-th group that is k-th closest to (farthest from) the reference cell column is to be accessed.

The buffer circuit $BU_R$ operates with voltage that is applied via the switch SW. Therefore, as the column to be accessed is located farther away from the reference circuit, the power-supply voltage rises in a stepwise manner and the driving capability increases in a stepwise manner.

Figure 12B:
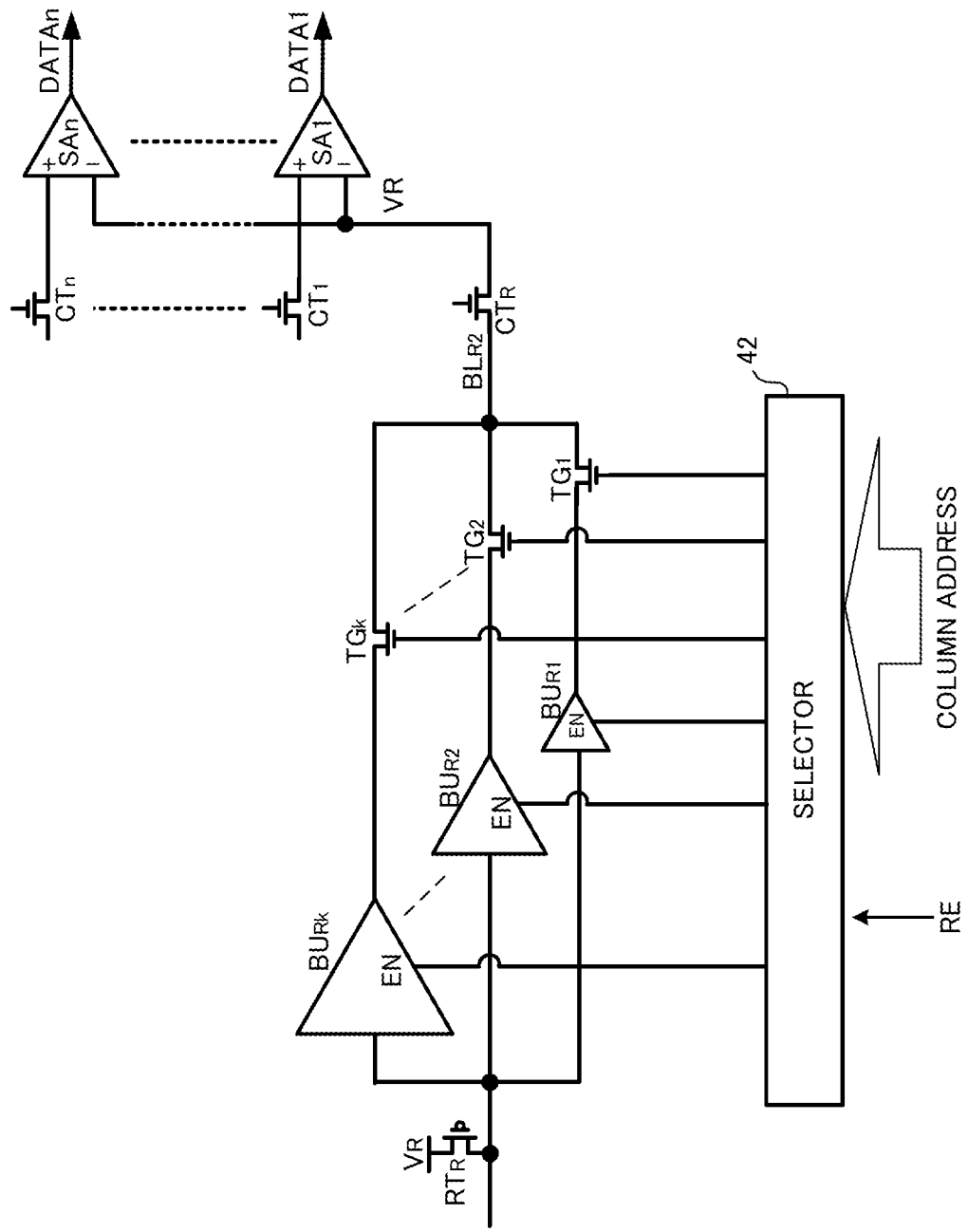

FIG. 12B exemplifies a configuration in which a plurality of buffer circuits $BU_{R1}$ to $BU_{Rk}$ having different current driving capabilities is switched according to a column to be accessed. In FIG. 12B, k buffer circuits $BU_{R1}$ to $BU_{Rk}$ are prepared. In terms of current driving capability, the buffer circuits $BU_{R1}$ to $BU_{Rk}$ are ordered as $BU_k \geq \ldots \geq BU_2 \geq BU_1$.

A first reference bit line $BL_{R1}$ is connected to positive input terminals of the k buffer circuits $BU_{R1}$ to $BU_{Rk}$ in common. Output terminals of the k buffer circuits $BU_{R1}$ to $BU_{Rk}$ are connected to a reference column selection transistor $CT_R$ via transfer gates $TG_1$ to $TG_k$, respectively.

A selector 42 decodes a column address, and supplies an enable signal to the buffer circuit $BU_1$ and also supplies an on-signal to the transfer gate $TG_1$ when a column belonging to the first group, which is closest to the reference circuit, is to be accessed, supplies the enable signal to the buffer circuit $BU_2$ and also supplies the on-signal to the transfer gate $TG_2$ when a column belonging to the second group, which is second closest to the reference circuit, is to be accessed, . . . , and supplies the enable signal to the buffer circuit $BU_k$ and also supplies the on-signal to the transfer gate $TG_k$ when a column belonging to the k-th group, which is k-th closest to (farthest from) the reference circuit, is to be accessed.

A buffer circuit $BU_R$ that is set to an enabled state by the selector 42 amplifies input voltage one-fold and applies a reference voltage $V_{ref2}$ to the vertical reference bit line VRBL via a transfer gate TG that is in an on-state. Therefore, as the column to be accessed is located farther away from the reference circuit, a buffer circuit BU that has a higher current driving capability is selected and the driving capability increases in a stepwise manner.

Note that, in the configuration in FIG. 12B, the buffer circuits having different current driving capabilities are achieved by, for example, i) differentiating power-supply voltages supplied to the buffer circuits, ii) differentiating sizes (in particular, channel widths) of transistors included in the buffer circuits from one another, iii) differentiating circuit configurations of the buffer circuits from one another, or iv) a combination of these methods. Alternatively, it may be configured such that, by changing a combination of buffer circuits that are brought to the enabled states at the same time, the current driving capability is changed. The above-described methods are examples, and the achievement method is not limited thereto.

Embodiment 5

Although, in Embodiment 3, the current driving capability of the reference circuit is increased by arranging the buffer circuit $BU_R$, the configuration is not limited thereto, and current driving capability itself of a reference circuit may be increased.

Figure 13:
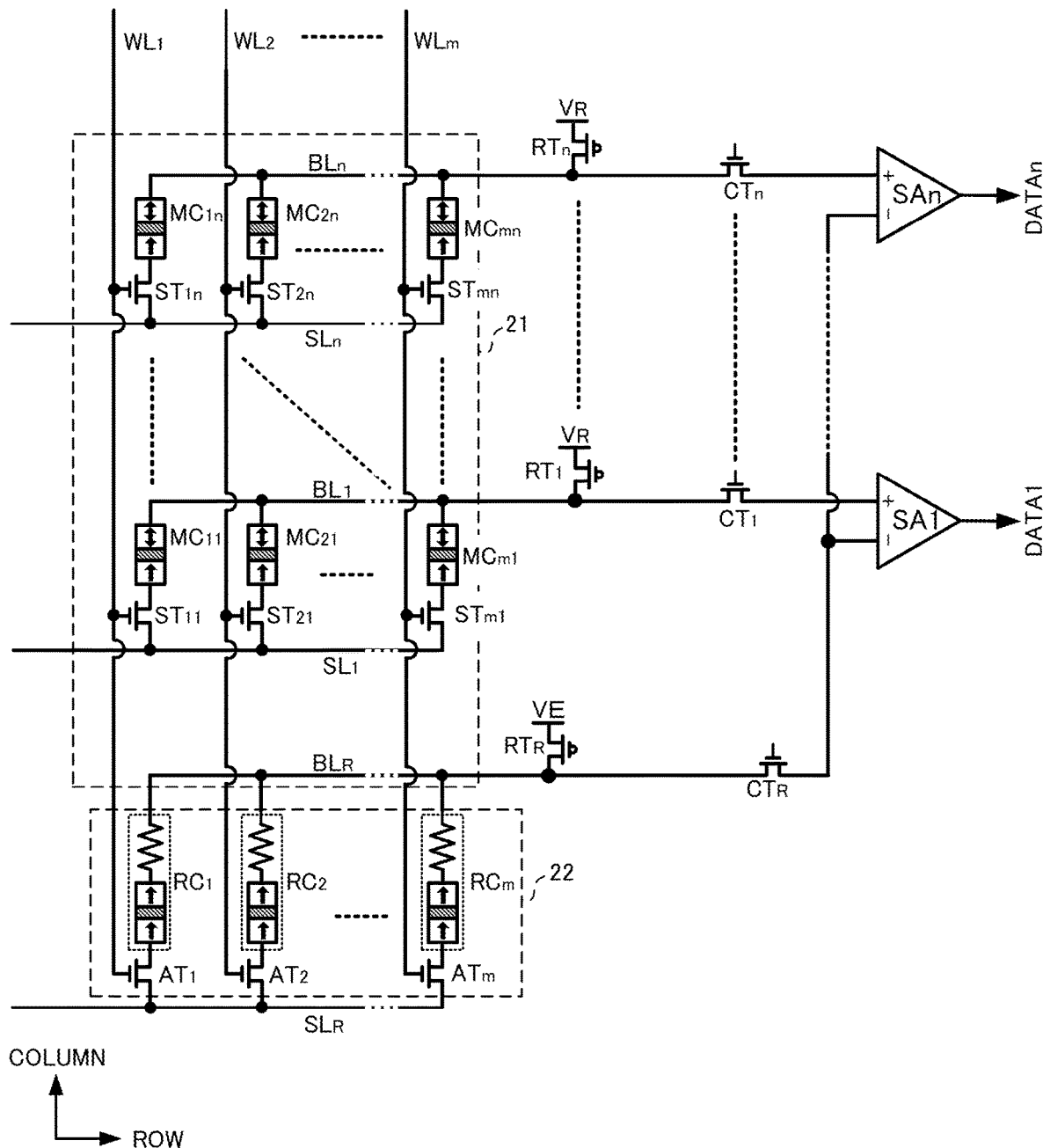
FIG. 13 is a block diagram of a main part of a storage circuit according to Embodiment 5.

For example, in a storage circuit 14 illustrated in FIG. 13, current driving capability of the reference circuit may be set relatively large by setting size of a reference read load transistor $RT_R$ larger than sizes of read load transistors $RT_1$ to $RT_n$.

For example, i) voltages VE and $V_R$ are set as VE=$V_R$, ii) the size (in particular, channel width) of the reference read load transistor $RT_R$ is set to be p (p>1) times the sizes (in particular, channel widths) of the read load transistors $RT_1$ to $RT_n$, iii) cross-sectional area of a resistor RF included in each reference cell $RC_i$ is increased p-fold and a resistance value thereof is decreased to l/p, and iv) cross-sectional area of an MTJ included in each reference cell $RC_i$ is increased p-fold and a resistance value thereof in a parallel state is decreased to $R_p/p$.

With such a configuration, it is possible to increase the current driving capability p-fold while maintaining reference voltage $V_{ref}$ and charge wiring capacitance of a vertical reference bit line VRBL with large current rapidly.

Alternatively, the voltages VE and $V_R$ are set as VE>$V_R$, and on-resistance of the reference read load transistor $RT_R$ and resistance (combined resistance of a fixed resistor FR and an MTJ element) of each reference cell $RC_i$ are adjusted in such a way that the reference voltage $V_{ref}$ expressed by the equation (2) has an appropriate value.

$$V_{ref}=VE(R_{RF}+R_p)/[(R_{RF}+R_p)+R_{on})] \quad (2)$$

where $R_{FR}$ denotes a resistance value of a fixed resistor FR, $R_p$ denotes a resistance value of an MTJ element in the parallel state, and $R_{on}$ denotes a value of the on-resistance of the reference read load transistor $RT_R$.

Figure 14:
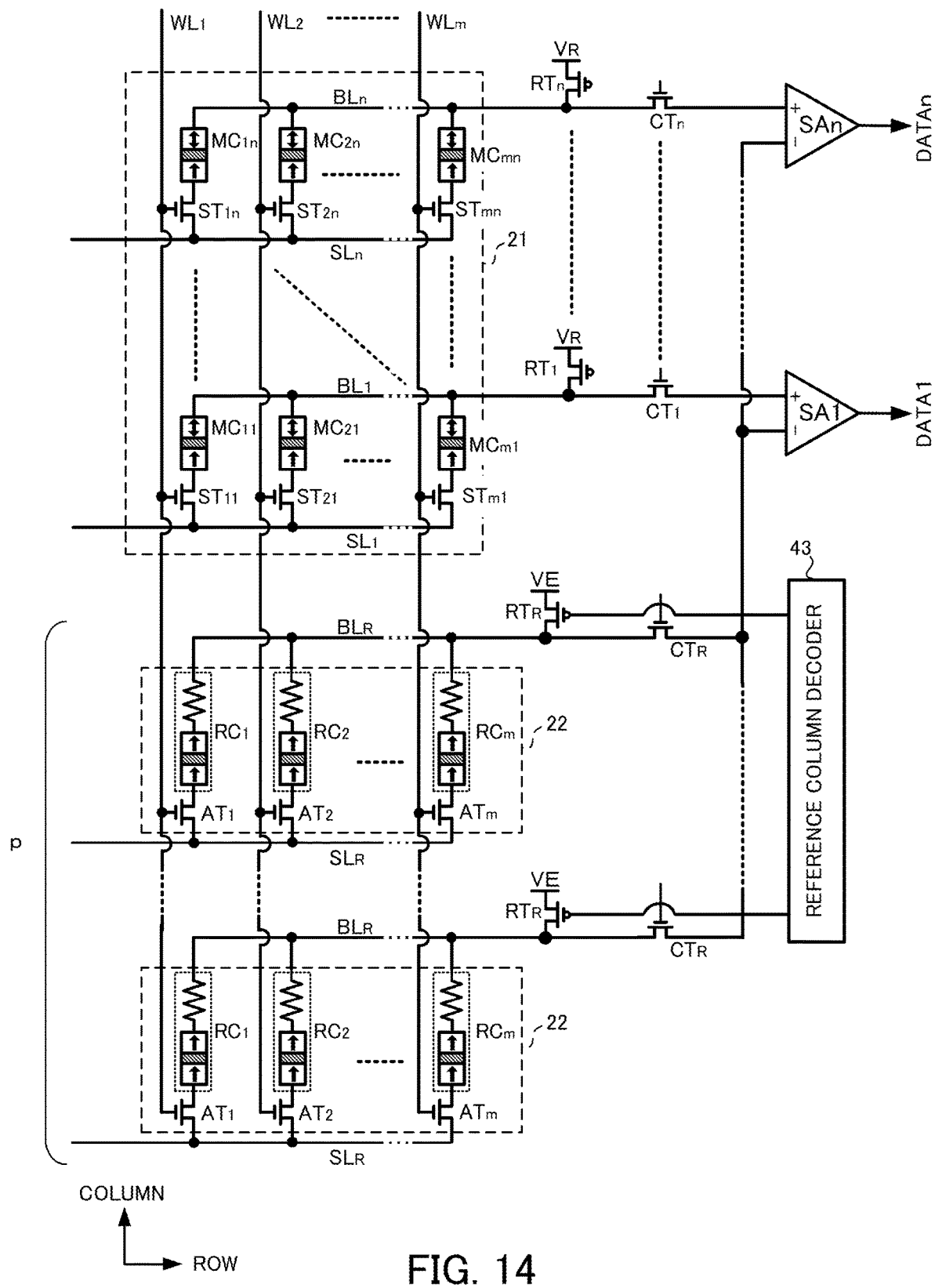
FIG. 14 is a block diagram of a main part of another storage circuit according to Embodiment 5.

Further, as illustrated in a storage circuit 15 in FIG. 14, a plurality of reference circuits, for example, p reference circuits, may be arranged in parallel with one another.

The p reference circuits may have the same current driving capability as one another or have current driving capabilities different from one another.

A reference column decoder 43 selects one or a plurality of reference circuits and applies an on-signal to the gates of reference read load transistors $RT_R$ of the selected reference circuits in such a way that optimum current driving capability can be obtained according to a column to be accessed.

The disclosure of the present application may produce an effect when the number m of rows and the number n of columns are large. In contrast, when the number m of rows and the number n of columns are small, an advantage of speed-up is small against a disadvantage of increase in a circuit size by an amount equivalent to a space for arranging buffer circuits $BU_j$. Thus, a relationship between circuit size and the effect of the present disclosure is verified below.

Figure 15:
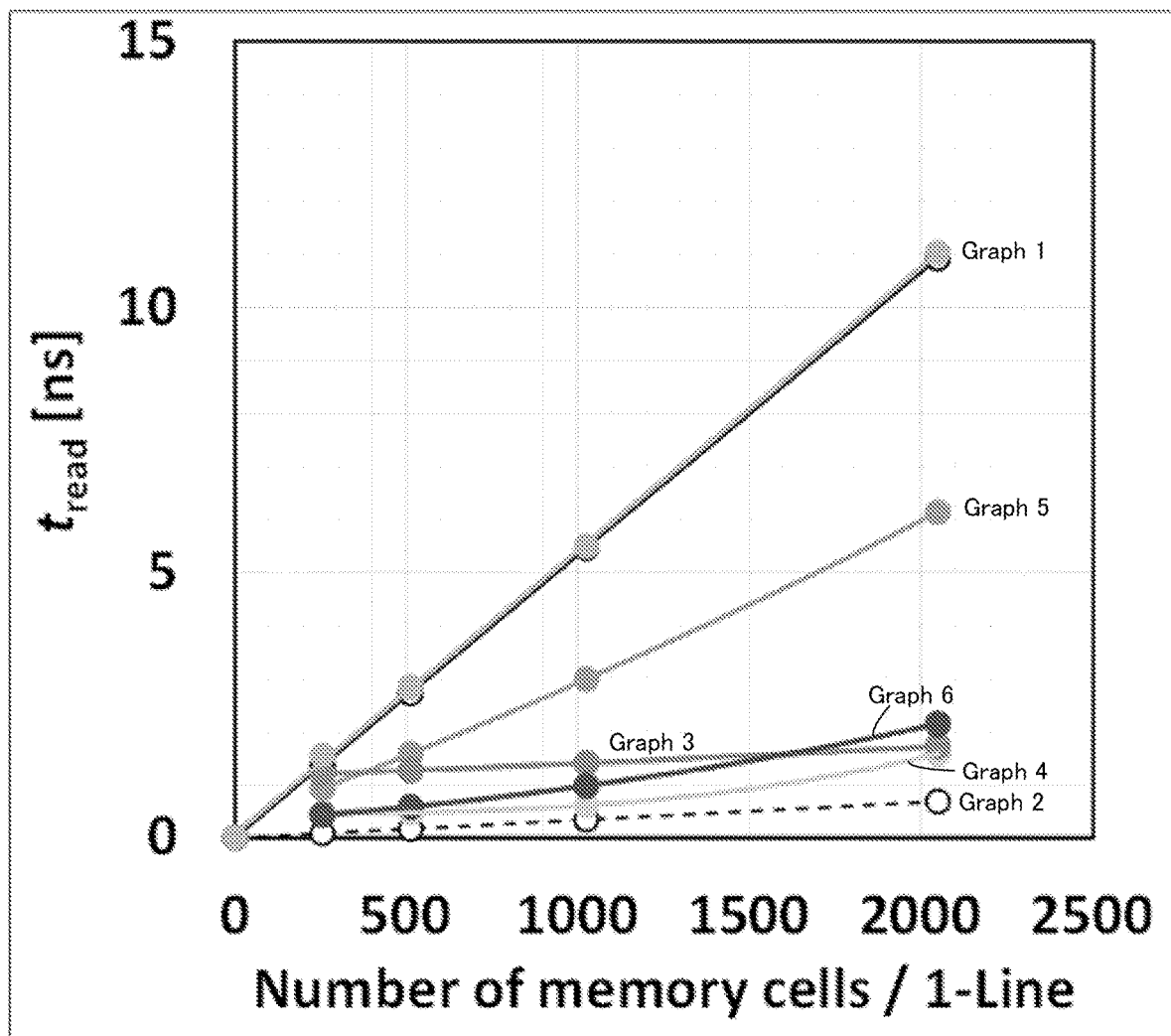
FIG. 15 is a diagram illustrating simulation results indicating a relationship between wiring driving time and storage capacity in storage circuits according to a prior art and the respective embodiments.
Figure 16:
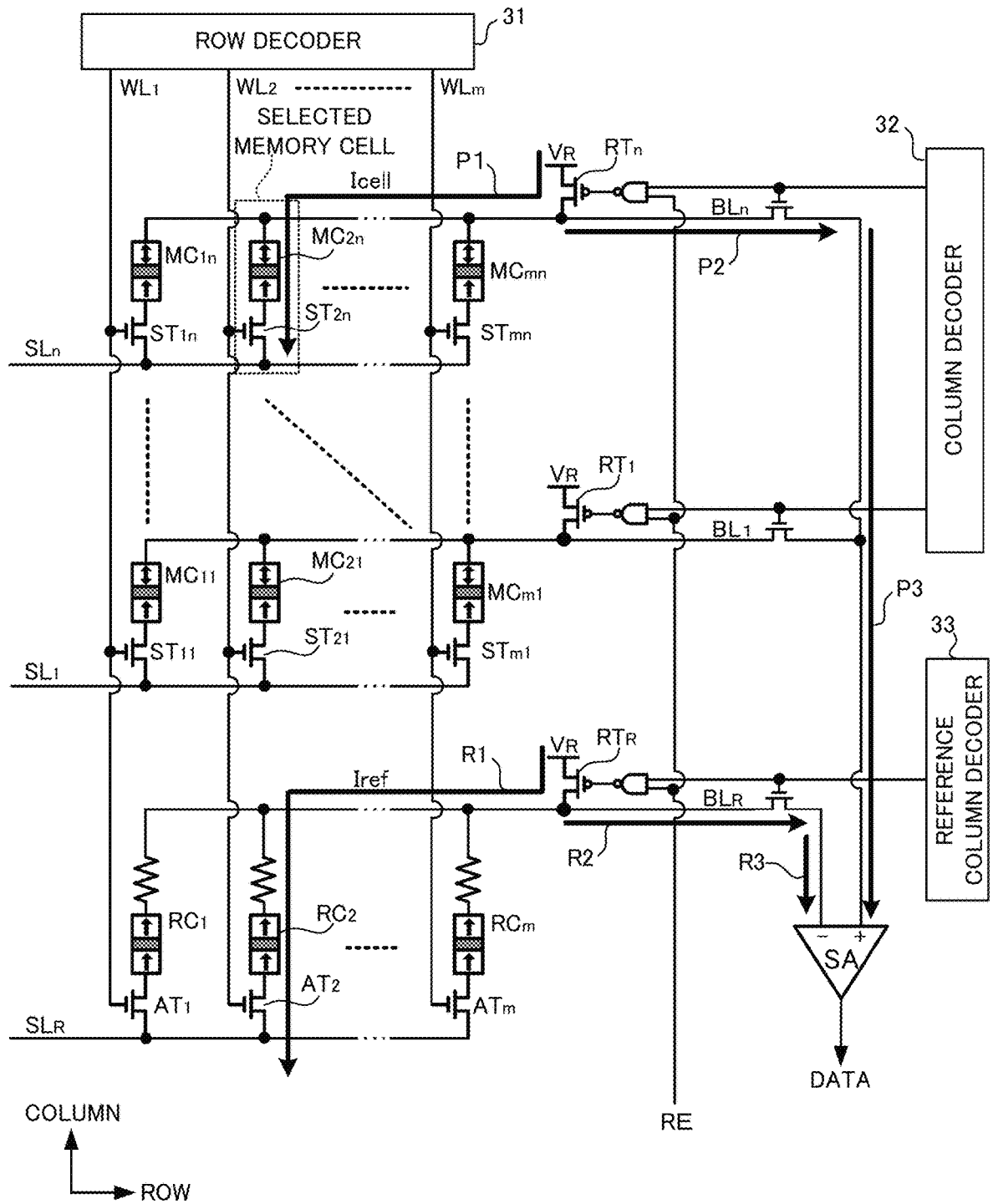
FIG. 16 is a block diagram for a description of a problem in a storage circuit disclosed in International Publication No. WO 2016/186086.

FIG. 15 illustrates simulation results of a relationship between length of the vertical bit line VBL (FIG. 1) or the vertical reference bit line VRBL (FIG. 11) and time (wiring driving time) $t_{read}$ required to drive the vertical bit line VBL or the vertical reference bit line VRBL, which is equivalent to delay time.

First, in a storage circuit in which neither a buffer circuit $BU_j$ nor a reference buffer circuit $BU_R$ is disposed (FIG. 15), wiring driving time $t_{read}$ of the vertical bit line VBL is defined by the equation below:

$$t_{read}=CL/I_{cell}.$$

In this equation, C denotes capacitance (wiring capacitance or parasitic capacitance) per unit length of the vertical bit line VBL or the vertical reference bit line VRBL. Herein, as a value of C, 208 aF/μm (208×10$^{-18}$ F/μm) is set as specified in International Roadmap for Devices and Systems (IRDS) 2018. Note that IRDS forecasts that the above numerical value does not change from the 20-nm generation onward. In addition, L denotes length of the vertical bit line VBL (or the vertical reference bit line VRBL, the same applies hereinafter) and corresponds to the number n of columns. $I_{cell}$ is current that flows from a read load transistor $RT_j$ to a memory cell $MC_{ij}$ and a bit line $BL_j$ and the vertical bit line VBL at the time of read operation.

Sizes in the column direction and the row direction of a combination of a memory cell $MC_{ij}$ and a selection transistor $ST_{ij}$ (or a combination of a reference memory cell $RC_j$ and a reference selection transistor $AT_i$) are 4 F when represented using a minimum processing dimension F because two wirings are required to be laid in each of the column direction and the row direction per combination. In area, the size is 16 F$^2$.

Herein, it is assumed that F=20 nm. It is also assumed that voltage of a bit line $BL_j$ is 0.8 V and the size of each transistor is a size determined using a design rule of the 55-nm channel length generation.

In addition, it is assumed that the read current $I_{cell}$, which is passed through each memory cell $MC_{ij}$ at the time of data read, is 40 μA that is a standard read current in the case of a storage capacity of 128 Mbits and 2.5 μA that the applicants forecast as a standard read current in the case of a storage capacity of 2 Gbits.

Results of simulation of a relationship between the number of bit lines BL connected to the vertical bit line VBL and the wiring driving time $t_{read}$ in the case where no buffer circuit $BU_j$ is disposed, which was performed based on the assumptions described above, are illustrated in graphs 1 and 2 in FIG. 15.

From the graph 2, it is evident that, at a standard read current $I_{cell}$=40 μA in the case of a storage capacity of 128 Mbits, which is a comparatively low capacity, the wiring driving time $t_{read}$ is sufficiently small because there is margin in the read current. In contrast, it is evident that, at a standard read current $I_{cell}$=2.5 μA in the case where increase in the storage capacity has advanced and the storage capacity has reached a capacity of 2 Gbits (graph 1), the wiring driving time becomes extremely large as the storage capacity increases. These observations reveal that it is desirable to take a countermeasure against future increase in the storage capacity.

Next, effects of the embodiments on the wiring driving time are examined.

As a prerequisite, the configurations of memory cells are the same. It is assumed that voltage of a bit line $BL_j$ is 0.8 V and the read current $I_{cell}$=2.5 μA.
i) Simulation 1:

A simulation result in the case where a voltage follower circuit illustrated in FIG. 6A or 6B is employed as a buffer circuit $BU_j$ in the storage circuit 11 illustrated in FIG. 1 is illustrated in a graph 3.

ii) Simulation 2:

A simulation result in the case where a voltage follower circuit illustrated in FIG. 6A or 6B is employed as a buffer circuit $BU_j$ in the storage circuit 13 illustrated in FIG. 11 is the same as the graph 3 due to similarity in the configurations.

iii) Simulation 3:

A simulation result in the case where a source follower circuit illustrated in FIG. 7A or 7B is employed as a buffer circuit $BU_j$ in the storage circuit 11 illustrated in FIG. 1 is illustrated in a graph 4.

iv) Simulation 4:

A simulation result in the case where a source follower circuit illustrated in FIG. 7A or 7B is employed as a buffer circuit $BU_j$ in the storage circuit 13 illustrated in FIG. 11 is the same as the graph 4 due to similarity in the configurations.

v) Simulation 5:

A simulation result in the case where the number p of reference circuits is set to 2 in the storage circuit illustrated in FIG. 14 is illustrated in a graph 5.

vi) Simulation 6:

A simulation result in the case where the number p of reference circuits is set to 4 in the storage circuit illustrated in FIG. 14 is illustrated in a graph 6.

Comparison between the graph 2 and the graphs 3 to 6 reveals that, although depending on the number of memory cells, the embodiments enables the wiring driving time $t_{read}$ to be reduced to ½ or less and the read speed to be increased under the common condition that the read current $I_{cell}$ is set to 2.5 µA.

The larger the number of memory cells connected to the vertical bit line VBL or the vertical reference bit line VRBL becomes, the larger effect of reduction in the wiring driving time $t_{read}$ is. This result has a significant effect for future increase in the storage capacity of the memory cells.

Further analysis reveals that, when, in a configuration in which buffer circuits are arranged, such as the configurations in FIGS. 1 and 11, voltage follower circuits as exemplified in FIG. 6 are employed as buffer circuits $BU_j$, the wiring driving time $t_{read}$ of the entire circuit is restricted by a delay time (approximately 1.5 ns) of the voltage follower circuits themselves and the wiring driving time $t_{read}$ does not depend much on the number of memory cells per wiring. In contrast, when source follower circuits as exemplified in FIG. 7 are employed, delay increases in proportion to a load although delay in the source follower circuits themselves is comparatively small.

In the configuration in which reference circuits are arranged in parallel, the wiring driving time $t_{read}$ depends on the number of memories per wiring and the number of parallel reference circuits and decreases as the number of parallel reference circuits increases.

The simulation results illustrated in FIG. 15 reveals that, even when the respective embodiments cause the storage circuit to be highly integrated and read current to become small, the respective embodiments described above enable the wiring driving time to be suppressed and the read speed to be increased.

In addition, as illustrated in the simulation results in FIG. 15, when the number of bit lines connected to the vertical bit line VBL or the vertical reference bit line VRBL is less than 256, there is no large difference in the wiring driving time $t_{read}$. In contrast, when the number of bit lines connected to the vertical bit line VBL or the vertical reference bit line VRBL becomes greater than or equal to 256, effect of reduction in the wiring driving time becomes larger as the number of bit lines increases. Therefore, it is considered that the respective embodiments are especially effective when the number of bit lines connected to the vertical bit line VBL or the vertical reference bit line VRBL is greater than or equal to 256.

Although the storage circuits according to a plurality of embodiments of the present disclosure were described above, the present disclosure is not limited to the above-described embodiments and can be changed appropriately.

For example, the storage element is not limited to the MTJ element, and the storage element is only required to be a variable resistance type element, such as a resistance random access memory (ReRAM). For example, the storage element is not limited to the MTJ element, and the storage element is only required to be a variable resistance type element, such as a resistance random access memory (ReRAM).

Although an example in which a resistance value can be changed in two steps was described, the resistance value may be changeable in three or more steps. In this case, a reference circuit that generates two or more reference voltages for determining in which step has the resistance is only required to be prepared.

The present disclosure is not limited to the description of the above-described embodiments and the drawings, and the above-described embodiments and the drawings can be modified as appropriate.

The foregoing describes some example embodiments for explanatory purposes. Although the foregoing discussion has presented specific embodiments, persons skilled in the art will recognize that changes may be made in form and detail without departing from the broader spirit and scope of the invention. Accordingly, the specification and drawings are to be regarded in an illustrative rather than a restrictive sense. This detailed description, therefore, is not to be taken in a limiting sense, and the scope of the invention is defined only by the included claims, along with the full range of equivalents to which such claims are entitled.

What is claimed is:

1. A storage circuit comprising:
a memory cell array including a matrix of memory cells each of which includes a variable resistance type element, the variable resistance type element having a resistance value changing in at least two steps;
a resistance-voltage conversion circuit disposed for each column of the memory cell array and configured to convert a resistance value of a memory cell to be read in a same column to a data voltage, the resistance-voltage conversion circuits each having a read transistor;
addressing means for receiving a column address and a row address, decoding the column address and row address, and accessing one of the memory cells addressed by the column address and the row address;
a reference circuit to generate a reference voltage for a plurality of sense amplifiers, the reference voltage being used for comparison with the data voltage, the reference circuit having a reference read transistor;
each of the plurality of sense amplifiers being disposed for each column of the memory cell array and configured to determine data stored in the memory cell to be read by receiving the data voltage generated by a resistance-voltage conversion circuit in a same column and the reference voltage generated by the reference circuit via first and second input terminals, respectively, and comparing both voltages with each other, and increasing means for increasing a first current driving capability of the reference circuit over a second driving current capability of each of the resistance-voltage conversion circuits;

wherein, each of the resistance-voltage conversion circuits is connected, through a bit line, to respective ones of the sense amplifiers, and the reference circuit is commonly connected, through a reference bit line, to the sense amplifiers;

the reference bit line is longer than each bit line, an effective length of the reference bit line required to be charged by the reference circuit is different between the sense amplifiers when data is read from the memory cell array, and the increasing means receives the column address and switches the first current driving capability of the reference circuit in accordance with the column address.

2. The storage circuit of claim 1 wherein an applied voltage of the reference read transistor is higher than an applied voltage of the read transistors, thereby increasing the first current driving capability of the reference circuit over the second current driving capability of each of the resistance-voltage conversion circuits.

3. The storage circuit of claim 1 comprising a buffer operatively connected to the output of the reference read transistor, thereby increasing the first current driving capability of the reference circuit over the second driving capability of each of the resistance-voltage conversion circuits.

4. The storage circuit of claim 1 comprising read resistance-voltage conversion circuit wiring between the read transistors and the sense amplifiers, and reference circuit wiring between the reference read transistor and sense amplifiers, wherein the first current driving capability increases as the length of the reference circuit wiring becomes longer.

5. The storage circuit of claim 4 comprising a plurality of the reference circuits arranged in parallel with one another, and controlling means for controlling which of the plurality of reference circuits are activated, the controlling means increasing the number of the reference circuits which are activated as the length of the reference circuits wiring becomes longer.

6. The storage circuit of claim 1 wherein the size of the reference read transistor is larger than the size of the read transistors, thereby increasing the first current driving capability of the reference circuit over the second current driving capability of each of the resistance-voltage conversion circuits.

7. The storage circuit of claim 1 wherein each of the sense amplifiers is deposited in respective one of the columns of the memory cell array, in one to one fashion.

8. The storage circuit of claim 1 wherein number of the columns of the memory cell array is a natural number n, number of the resistance-voltage conversion circuit is n, number of the sense amplifiers is n, number of the reference circuit is less than n.

9. The storage circuit according to claim 1, wherein the increasing means switches the first current driving capability of the reference circuit with step wise manner in accordance with the column address.

10. The storage circuit according to claim 9, wherein the increasing means increases the first current driving capability of the reference circuit as distance between a column of the memory cell array addressed by the column address and the reference circuit increases.

11. The storage circuit according to claim 10, wherein the increasing means switches power supply voltages applied for operating the reference circuit to switch the first current driving capability of the reference circuit in accordance with the column address.

12. The storage circuit according to claim 10, wherein the reference circuit includes a plurality of buffer circuits having different current driving capability from each other, each of buffer circuits buffering the reference voltage, and outputting the buffered reference voltage to the plurality of sense amplifiers through the reference bit line, and the increasing means activates one of the buffer circuits in accordance with the column address.

13. The storage circuit according to claim 10, further comprising at least one additional reference circuit for generating the reference voltage, the increasing means activates at least one of the reference circuits to switch the current driving capability in accordance with the column address.

* * * * *